United States Patent
Nakao et al.

(10) Patent No.: US 12,461,444 B2
(45) Date of Patent: Nov. 4, 2025

(54) SULFONIUM SALT, PHOTOACID GENERATOR, CURABLE COMPOSITION, AND RESIST COMPOSITION

(71) Applicant: SAN-APRO LTD., Kyoto (JP)

(72) Inventors: Takuto Nakao, Kyoto (JP); Yuji Nakamura, Kyoto (JP)

(73) Assignee: SAN-APRO LTD., Kyoto (JP)

( * ) Notice: Subject to any disclaimer, the term of this patent is extended or adjusted under 35 U.S.C. 154(b) by 556 days.

(21) Appl. No.: 17/789,571

(22) PCT Filed: Jan. 4, 2021

(86) PCT No.: PCT/JP2021/000009
§ 371 (c)(1),
(2) Date: Jun. 28, 2022

(87) PCT Pub. No.: WO2021/186846
PCT Pub. Date: Sep. 23, 2021

(65) Prior Publication Data
US 2023/0100642 A1  Mar. 30, 2023

(30) Foreign Application Priority Data
Mar. 17, 2020 (JP) .................. 2020-046335

(51) Int. Cl.
G03F 7/004 (2006.01)
C07C 309/06 (2006.01)
C07C 381/12 (2006.01)
C07F 7/18 (2006.01)
G03F 7/038 (2006.01)
G03F 7/039 (2006.01)

(52) U.S. Cl.
CPC .......... G03F 7/0045 (2013.01); C07C 309/06 (2013.01); C07C 381/12 (2013.01); C07F 7/1804 (2013.01); G03F 7/0382 (2013.01); G03F 7/0392 (2013.01)

(58) Field of Classification Search
CPC .... G03F 7/0045; G03F 7/0382; G03F 7/0392; G03F 7/0397; G03F 7/004; G03F 7/0042; C08C 381/12
See application file for complete search history.

(56) References Cited

U.S. PATENT DOCUMENTS

| | | | |
|---|---|---|---|
| 8,617,787 B2 * | 12/2013 | Suzuki | G03F 7/0397 430/913 |
| 2009/0197987 A1 | 8/2009 | Hayoz et al. | |
| 2009/0208872 A1 | 8/2009 | Wolf et al. | |
| 2019/0300476 A1 | 10/2019 | Fukunaga et al. | |
| 2021/0147352 A1 | 5/2021 | Nakao et al. | |
| 2022/0089562 A1 | 3/2022 | Nakao | |

FOREIGN PATENT DOCUMENTS

| | | | |
|---|---|---|---|
| JP | 50-151997 A | | 12/1975 |
| JP | 2-178303 A | | 7/1990 |
| JP | 9-118663 A | | 5/1997 |
| JP | 10-287643 A | | 10/1998 |
| JP | 2008120700 A | * | 5/2008 |
| JP | 2009-533377 A | | 9/2009 |
| JP | 2010-215616 A | | 9/2010 |
| JP | 2012-27290 A | | 2/2012 |
| JP | 2018-24598 A | | 2/2018 |
| WO | 2007/003507 A1 | | 1/2007 |
| WO | 2011/016425 A1 | | 2/2011 |
| WO | 2018/003470 A1 | | 1/2018 |
| WO | 2019/225185 A1 | | 11/2019 |
| WO | 2020/145043 A1 | | 7/2020 |

OTHER PUBLICATIONS

JP2008120700 English Translation (Year: 2024).*
International Search Report dated Feb. 16, 2021, issued in counterpart International Application No. PCT/JP2021/000009 (2 pages).

* cited by examiner

Primary Examiner — Mark F. Huff
Assistant Examiner — Kevin J Drummey
(74) Attorney, Agent, or Firm — WHDA, LLP

(57) ABSTRACT

Provided are: a new sulfonium salt highly photosensitive to active energy ray, in particular, i-line or h-line; and a new photoacid generator which is highly photosensitive to i-line or h-line, and comprises a sulfonium salt that is highly soluble in a solvent and a cationically polymerizable compound such as an epoxy compound, and has excellent storage stability in the formulation. The present invention pertains to a sulfonium salt represented by general formula (1), and a photoacid generator comprising said sulfonium salt.

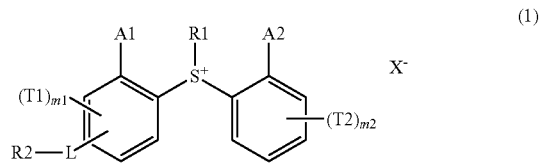

15 Claims, No Drawings

SULFONIUM SALT, PHOTOACID GENERATOR, CURABLE COMPOSITION, AND RESIST COMPOSITION

TECHNICAL FIELD

The present invention relates firstly to a sulfonium salt and secondly to a photoacid generator, more specifically, a photoacid generator containing a specific sulfonium salt suitable for curing a cationically polymerizable compound by the action of an active energy ray such as light, an electron beam, or an X-ray.

The present invention relates thirdly to a curable composition containing the photoacid generator and a cured product obtained by curing the same.

The present invention relates fourthly to a chemically amplified positive photoresist composition containing the photoacid generator and a method for forming a resist pattern using the composition.

The present invention relates fifthly to a chemically amplified negative photoresist composition containing the photoacid generator and a cured product obtained by curing the same.

BACKGROUND ART

A photoacid generator is a generic name for a compound which decomposes and generates an acid by application of heat or an active energy ray such as an electron beam, or an X-ray, and is used for several reactions such as polymerization, crosslinking reaction and deprotection reaction as an active species, an acid generated by application of an active energy ray.

Specific examples of these reactions include a polymerization of a cationically polymerizable compound in the field such as paints, adhesives, and photo molding materials; and photolithography in manufacture of electric parts and formation of semiconductor elements (that is, a crosslinking reaction of a phenol resin under crosslinking agent, and a deprotection reaction of polymer having an alkali-soluble resin as a protecting group).

Recently, manufacture of electric parts and formation of semiconductor elements are being done actively by making full use of photolithographic technology using photoresists, and i-line with a wavelength of 365 nm is widely used as an active energy ray for the manufacture of various precision parts such as semiconductor packages. Some reasons for this are that medium- or high-pressure mercury lamps, which are available as irradiation light sources at a low cost and have high emission intensity, can be used.

Also, medium- or high-pressure mercury lamps can be used most commonly in the field of paints, adhesives, and photo molding materials other than photolithography and recently, LED lamps have been used by an advantage such as energy saving, and long life. Not only commonly LED lamps having an emission wavelength in the i-line region (360 nm to 390 nm), but also LED lamps having a higher optically-transparent wavelength in the h-line region (400 nm to 420 nm), and LED lamps having a long wavelength in the visible light region have been used.

As the result, the wavelength region necessary for photoacid generators is introduced to many divergences.

Among existing photoacid generators, triarylsulfonium salts (Patent Document 1), phenacylsulfonium salts having a naphthalene skeleton (Patent Document 2), and dialkylbenzylsulfonium salts (Patent Document 3) have low photosensitivity and therefore need to be used in combination with a sensitizer so that the sensitivity can be increased. However, many sensitizers have low compatibility with resins and photoacid generators, therefore the use of sensitizers has been limited. Triarylsulfonium salts disclosed by Patent Documents 4 to 7 have high photosensitivity without using a sensitizer together, by having big absorption of i-line, h-line, or visible light, because of the expanded $\pi$ conjugated system. However, when a curable composition or a photoresist composition is contained the above triarylsulfonium salts having big absorption, the light irradiated is strongly absorbed only at the surface of the composition, therefore it may become that the reactivity becomes poor, because the light does not transmit in the deep part. Therefore ideally, a photoacid generator having high photosensitivity is expected without increasing the light absorption.

PRIOR ART DOCUMENTS

Patent Documents

Patent Document 1: Japanese Patent Application Laid-Open (JP-A) No. 50-151997
Patent Document 2: JP-A No. 09-11663
Patent Document 3: JP-A No. 02-178303
Patent Document 4: JP-A No. 10-287643
Patent Document 5: JP-A No. 2009-533377
Patent Document 6: JP-A No. 2010-215616
Patent Document 7: JP-A No. 2018-24598

SUMMARY OF THE INVENTION

Problems to be Solved by the Invention

Under the above circumstances, a first object of the present invention is to provide a new sulfonium salt having high photosensitivity without increasing the light absorption greatly.

A second object of the present invention is to provide a new photoacid generator that comprises a sulfonium salt and has high photosensitivity and also has excellent storage stability when formulated with a cationically polymerizable compound such as an epoxy compound.

A third object of the present invention is to provide an energy ray-curable composition and a cured product each produced with the above photoacid generator.

A fourth object of the present invention is to provide a chemically amplified positive photoresist composition produced with the above photoacid generator, and a method for the composition.

A fifth object of the present invention is to provide a chemically amplified negative photoresist composition and a cured product each produced with the above photoacid generator.

Means for Solving the Problems

The inventors have found that a sulfonium salt represented by general formula (1) described below is suitable for achieving the above objects. Thus, the present invention provides a sulfonium salt represented by general formula (1) described below.

[Chemical Formula 1]

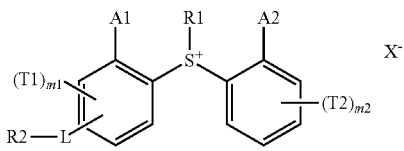

(1)

[in formula (1), R1 and R2 each independently represent an aryl group having 6 to 14 carbon atoms, and some of hydrogen atoms in the aryl group may be substituted with a substituent (t); the substituent (t) represents an alkyl group having 1 to 8 carbon atoms or an aryl group having 6 to 10 carbon atoms, the substituent (t) may be bonded together directly via a single bond, or through a group represented by —SO—, —SO$_2$—, or —CO, with R1 and R2; A1 and A2 each independently represent a hydrogen atom, a branched alkyl group having 3 to 7 carbon atoms, a branched alkoxy group having 3 to 7 carbon atoms, a tertiary silyl group having 3 to 9 carbon atoms, or a tertiary siloxy group having 3 to 9 carbon atoms, provided that both of A1 and A2 do not represent a hydrogen atom; T1 and T2 each independently represent an alkyl group having 1 to 7 carbon atoms, an alkoxy group having 1 to 7 carbon atoms, a silyl group having 3 to 9 carbon atoms, or a siloxy group having 3 to 9 carbon atoms; m1 and m2 each represent the number of occurrences of each of T1 and T2, m1 represents an integer of 0 to 3, m2 represents an integer of 0 to 4; L represents —O—, —S—, —SO—, —SO$_2$—, or —CO; S represents sulfur atom, O represents oxygen atom, C represents carbon atom; and X$^-$ represents a monovalent polyatomic anion.]

The present invention also provides a photoacid generator comprising the above sulfonium salt.

The present invention also provides an energy ray-curable composition, comprising the above photoacid generator and a cationically polymerizable compound.

The present invention further provides a cured product obtained by curing the above energy ray-curable composition.

The present invention further provides a chemically amplified positive photoresist composition comprising the above photoacid generator and a resin ingredient (B) increasing its solubility in an alkali under the action of an acid.

The present invention further provides a method for forming a resist pattern, comprising: a lamination step of laminating a photoresist layer with a thickness of 5 to 150 µm comprising any one of the above chemically amplified positive photoresist compositions to obtain a photoresist laminate; an exposure step of site-selectively irradiating the photoresist laminate with light or a radiation; and a development step of developing the photoresist laminate after the exposure step to obtain a resist pattern.

The present invention further provides a chemically amplified negative photoresist composition comprising: the above photoacid generator; an ingredient (F) that is an alkali-soluble resin having a phenolic hydroxyl group; and a crosslinking agent ingredient (G).

The present invention further provides a cured product obtained by curing any one of the above chemically amplified negative photoresist compositions.

Effects of the Invention

The sulfonium salt of the present invention has excellent photosensitivity to active energy rays such as visible light, ultraviolet rays, electron beams, and X-rays, and high compatibility with a solvent and a cationically polymerizable compound such as an epoxy compound, and also has excellent storage stability when formulated with a cationically polymerizable compound such as an epoxy compound.

Also, the sulfonium salt of the present invention has high photosensitivity without increasing absorption of ultraviolet rays, therefore when a curable composition or a photoresist composition is contained the sulfonium salt, the transparency and the reactivity of the compositions is excellent.

The photoacid generator of the present invention has excellent curing properties under the action of ultraviolet light, particularly, i-line and h-line, when used to cure a cationically polymerizable compound, and makes it possible to cure a cationically polymerizable compound without using a sensitizer together.

The energy ray-curable composition of the present invention contains the above photoacid generator and therefore can be cured with ultraviolet light. The energy ray-curable composition of the present invention also has high storage stability and excellent cost effectiveness and workability, because no sensitizer needs to be used.

The energy ray-curable composition of the present invention also has excellent thick-film-curing properties, because the transparency of the composition to ultraviolet light is excellent.

The cured product of the present invention can be obtained with no sensitizer and therefore is free from the problem of discoloration or deterioration, which would be caused by any residual sensitizer.

The chemically amplified positive photoresist composition and the chemically amplified negative photoresist composition of the present invention each contain the above photoacid generator and therefore can form a resist with high sensitivity to i-line and h-line, in other words, it is possible to form pattern by low exposure compared with conventional compositions. The chemically amplified positive photoresist composition and the chemically amplified negative photoresist composition of the present invention also have high storage stability and can form a good resist pattern shape.

The chemically amplified positive photoresist composition and the chemically amplified negative photoresist composition of the present invention have excellent photoreactivity (sensitivity) at the thick-film of the composition, because the transparency of the composition to ultraviolet light is high.

MODE FOR CARRYING OUT THE INVENTION

Hereinafter, embodiments of the present invention are described in detail.

A sulfonium salt of the present invention is represented by general formula (1) described below.

[Chemical Formula 2]

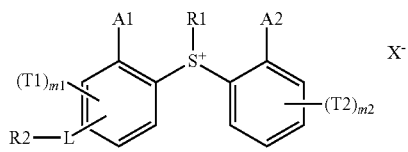

(1)

[in formula (1), R1 and R2 each independently represent an aryl group having 6 to 14 carbon atoms, and some of hydrogen atoms in the aryl group may be substituted with a substituent (t); the substituent (t) represents an alkyl group having 1 to 8 carbon atoms or an aryl group having 6 to 10 carbon atoms, the substituent (t) may be bonded together directly via a single bond, or through a group represented by —SO—, —SO$_2$—, or —CO, with R1 and R2; A1 and A2 each independently represent a hydrogen atom, a branched alkyl group having 3 to 7 carbon atoms, a branched alkoxy group having 3 to 7 carbon atoms, a tertiary silyl group having 3 to 9 carbon atoms, or a tertiary siloxy group having 3 to 9 carbon atoms, provided that both of A1 and A2 do not represent a hydrogen atom; T1 and T2 each independently represent an alkyl group having 1 to 7 carbon atoms, an alkoxy group having 1 to 7 carbon atoms, a silyl group having 3 to 9 carbon atoms, or a siloxy group having 3 to 9 carbon atoms; m1 and m2 each represent the number of occurrences of each of T1 and T2, m1 represents an integer of 0 to 3, m2 represents an integer of 0 to 4; L represents —O—, —S—, —SO—, —SO$_2$—, or —CO; S represents sulfur atom, O represents oxygen atom, C represents carbon atom; and X$^-$ represents a monovalent polyatomic anion.]

Among R1 and R2, examples of the aryl group include aryl groups having 6 to 14 carbon atoms (such as phenyl, tolyl, dimethylphenyl, biphenylyl, naphthyl, fluorenyl, fluorenonyl, antrasenyl and anthraquinonyl).

R1 and R2 may be the same or different from one another, and may be different partly, but the same is preferable.

Some of hydrogen atoms in the aryl group of R1 and R2 may be substituted with a substituent (t). The substituent (t) represents an alkyl group having 1 to 8 carbon atoms or an aryl group having 6 to 10 carbon atoms, the substituent (t) may be bonded together directly via a single bond or through a group represented by —SO—, —SO$_2$—, or —CO with R1 and R2.

Among the substituent (t), examples of the alkyl group having 1 to 8 carbon atoms include straight chain alkyl groups (such as methyl, ethyl, n-propyl, n-butyl, n-pentyl, and n-octyl), branched chain alkyl groups (such as isopropyl, isobutyl, sec-butyl, tert-butyl, isopentyl, neopentyl, tert-pentyl, isohexyl, and isooctadecyl), and cycloalkyl groups (such as cyclopropyl, cyclobutyl, cyclopentyl, and cyclohexyl).

Among the substituent (t), examples of the aryl group having 6 to 10 carbon atoms include phenyl, tolyl, dimethylphenyl, and, naphthyl.

Among A1 and A2, examples of the branched chain alkyl group having 3 to 7 carbon atoms include isopropyl, isobutyl, sec-butyl, tert-butyl, isopentyl, neopentyl, tert-pentyl, isohexyl.

Among A1 and A2, examples of the branched chain alkoxy group having 3 to 7 carbon atoms include isopropoxy, isobutoxy, sec-butoxy, and tert-butoxy.

Among A1 and A2, examples of the tertiary silyl group having 3 to 9 carbon atoms include trimethylsilyl, triethylsilyl, tert-butyldimethylsilyl, and triisopropylsilyl.

Among A1 and A2, examples of the tertiary siloxy group having 3 to 9 carbon atoms include trimethylsiloxy, triethylsiloxy, tert-butyldimethylsiloxy, and triisopropylsiloxy.

A1 and A2 may be the same or different from one another, provided that both of A1 and A2 do not represent a hydrogen atom. At least one of A1 and A2 preferably represents a group selected from a tert-butyl group, a tert-butoxy group and a trimethylsiloxy group, more preferably represents a tert-butyl group from the viewpoint of availability of industrial raw materials.

Among T1 and T2, examples of the alkyl group having 1 to 7 carbon atoms include straight chain alkyl groups (such as methyl, ethyl, propyl, butyl, pentyl, and benzyl), branched chain alkyl groups (such as isopropyl, isobutyl, sec-butyl, tert-butyl, isopentyl, neopentyl, tert-pentyl, and isohexyl), and cycloalkyl groups (such as cyclopropyl, cyclobutyl, cyclopentyl, and cyclohexyl).

Among T1 and T2, examples of the alkoxy group having 1 to 7 carbon atoms include straight or branched chain alkoxy groups (such as methoxy, ethoxy, propoxy, isopropoxy, butoxy, isobutoxy, sec-butoxy, tert-butoxy, and hexyloxy.

Among T1 and T2, examples of the silyl group having 3 to 9 carbon atoms include trimethylsilyl, triethylsilyl, tert-butyldimethylsilyl, and triisopropylsilyl.

Among T1 and T2, examples of the siloxy group having 3 to 9 carbon atoms include trimethylsiloxy, triethylsiloxy, tert-butyldimethylsiloxy, and triisopropylsiloxy.

T1 and T2 may be the same or different from one another, and may be different partly.

m1 represents the number of occurrences of T1, m1 represents an integer of 0 to 3, preferably represents an integer of 0 to 2, more preferably represent 0 or 1. m2 represents the number of occurrences of T2, m2 represents an integer of 0 to 4, preferably represents an integer of 0 to 2.

L is a group represented by —O—, —S—, —SO—, —SO$_2$—, or —CO, preferably represented by —S—, —SO—, or —SO$_2$—. S represents sulfur atom, O represents oxygen atom, C represents carbon atom.

X$^-$ is not restricted, as long as it represents a monovalent polyatomic anion. X$^-$ represents an anion corresponding to an acid (HX) which is produced by irradiating the sulfonium salt of the present invention with an active energy ray (such as visible light, an ultraviolet ray, an electron beam, or an X-ray). X$^-$ preferably represents an anion represented by MY$_a^-$, (Rf)$_b$PF$_{6-b}^-$, R$^3{}_c$BY$_{4-c}^-$, R$^3{}_c$GaY$_{4-c}^-$, R$^4$SO$_3^-$, (R$^4$SO$_2$)$_3$C—, or (R$^4$SO$_2$)$_2$N—.

M represents a phosphorus atom, a boron atom, or an antimony atom. Y represents a halogen atom (preferably a fluorine atom).

Rf represents an alkyl group (preferably an alkyl group having 1 to 8 carbon atoms) whose 80% by mole or more of hydrogen atoms are substituted with fluorine atoms. Examples of the alkyl group to be substituted with fluorine for Rf include straight chain alkyl groups (such as methyl, ethyl, propyl, butyl, pentyl, and octyl), branched alkyl groups (such as isopropyl, isobutyl, sec-butyl, and tert-butyl), and cycloalkyl groups (such as cyclopropyl, cyclobutyl, cyclopentyl, and cyclohexyl). The ratio at which the hydrogen atoms of these alkyl groups are substituted with fluorine atoms in Rf is preferably 80% by mole or more, more preferably 90% by mole or more, in particular, preferably 100% by mole, based on the molar number of the hydrogen atoms in the original alkyl group. When the fluorine atom substitution ratio is in the preferred ranges, the sulfonium salt will have higher photosensitivity. In particular, preferred examples of Rf include CF$_3$—, CF$_3$CF$_2$—, (CF$_3$)$_2$CF—, CF$_3$CF$_2$CF$_2$—, CF$_3$CF$_2$CF$_2$CF$_2$—, (CF$_3$)$_2$CFCF$_2$—, CF$_3$CF$_2$(CF$_3$)CF—, and (CF$_3$)$_3$C—. The number of occurrences b of Rf are independent of one another and therefore may be the same or different from one another.

P represents a phosphorus atom, and F represents a fluorine atom.

$R^3$ represents a phenyl group whose hydrogen atoms are partially substituted with at least one element or electron-withdrawing group. For example, such one element includes a halogen atom, examples of which include a fluorine atom, a chlorine atom, and a bromine atom. Examples of the electron-withdrawing group include a trifluoromethyl group, a nitro group, and a cyano group. Among them, preferred is a phenyl group one of whose hydrogen atoms is substituted with a fluorine atom or a trifluoromethyl group. The number of occurrences c of $R^3$ groups are independent of one another and therefore may be the same or different from one another.

B represents a boron atom, and Ga represents a gallium atom.

$R^4$ represents an alkyl group having 1 to 20 carbon atoms, a perfluoroalkyl group having 1 to 20 carbon atoms, or an aryl group having 6 to 20 carbon atoms, wherein the alkyl group and the perfluoroalkyl group may each be any of a straight chain, a branched chain, or a cyclic group, and the aryl group may be substituted or unsubstituted.

S represents a sulfur atom, O represents an oxygen atom, C represents a carbon atom, and N represents a nitrogen atom.

a represents an integer of 4 to 6.

b preferably represents an integer of 1 to 5, more preferably 2 to 4, in particular, preferably 2 or 3.

c preferably represents an integer of 1 to 4, more preferably 4.

Examples of the anion represented by $MY_a^-$ include anions represented by $SbF_6^-$, $PF_6^-$, and $BF_4^-$.

Examples of the anion represented by $(Rf)_bPF_{6-b}^-$ include anions represented by $(CF_3CF_2)_2PF_4^-$, $(CF_3CF_2)_3PF_3^-$, $((CF_3)_2CF)_2PF_4$, $((CF_3)_2CF)_3PF_3^-$, $(CF_3CF_2CF_2)_2PF_4^-$, $(CF_3CF_2CF_2)_3PF_3^-$, $((CF_3)_2CFCF_2)_2PF_4^-$, $((CF_3)_2CFCF_2)_3PF_3^-$, $(CF_3CF_2CF_2CF_2)_2PF_4^-$, and $(CF_3CF_2CF_2CF_2)_3PF_3^-$. Among them, preferred are anions represented by $(CF_3CF_2)_3PF_3^-$, $(CF_3CF_2CF_2)_3PF_3^-$, $((CF_3)_2CF)_3PF_3^-$, $((CF_3)_2CF)_2PF_4^-$, $((CF_3)_2CFCF_2)_3PF_3^-$, and $((CF_3)_2CFCF_2)_2PF_4^-$, in particular, preferred are anions represented by $(CF_3CF_2)_3PF_3^-$, and $(CF_3CF_2CF_2)_3PF_3^-$.

Examples of the anion represented by $R^3_cBY_{4-c}^-$ include anions represented by $(C_6F_5)_4B^-$, $((CF_3)_2C_6H_3)_4B^-$, $(CF_3C_6H_4)_4B^-$, $(C_6F_5)_2BF_2^-$, $C_6F_5BF_3^-$, and $(C_6H_3F_2)_4B^-$. Among them, preferred are anions represented by $(C_6F_5)_4B^-$, $(C_6H_5)(C_6F_5)_3B^-$, and $((CF_3)_2C_6H_3)_4B^-$.

Examples of the anion represented by $R^3_cGaY_{4-c}^-$ include anions represented by $(C_6F_5)_4Ga^-$, $((CF_3)_2C_6H_3)_4Ga^-$, $(CF_3C_6H_4)_4Ga^-$, $(C_6F_5)_2GaF_2^-$, $C_6F_5GaF_3^-$, and $(C_6H_3F_2)_4Ga^-$. Among them, preferred are anions represented by $(C_6F_5)_4Ga^-$ and $((CF_3)_2C_6H_3)_4Ga^-$.

Examples of the anion represented by $R^4SO_3^-$ include trifluoromethanesulfonate anion, pentafluoroethanesulfonate anion, heptafluoropropanesulfonate anion, nonafluorobutanesulfonate anion, pentafluorophenylsulfonate anion, p-toluenesulfonate anion, benzenesulfonate anion, camphorsulfonate anion, methanesulfonate anion, ethanesulfonate anion, propanesulfonate anion, and butanesulfonate anion. Among them, preferred are trifluoromethanesulfonate anion, nonafluorobutanesulfonate anion, methanesulfonate anion, camphorsulfonate anion, benzenesulfonate anion, and p-toluenesulfonate anion.

Examples of the anion represented by $(R^4SO_2)_3C^-$ include anions represented by $(CF_3SO_2)_3C^-$, $(C_2F_5SO_2)_3C^-$, $(C_3F_7SO_2)_3C^-$, and $(C_4F_9SO_2)_3C^-$.

Examples of the anion represented by $(R^4SO_2)_2N^-$ include anions represented by $(CF_3SO_2)_2N^-$, $(C_2F_5SO_2)_2N^-$, $(C_3F_7SO_2)_2N^-$, and $(C_4F_9SO_2)_2N^-$.

Examples of the monovalent polyatomic anion that may be used include not only anions represented by $MY_a^-$, $(Rf)_bPF_{6-b}^-$, $R^3_cBY_{4-c}^-$, $R^3_cGaY_{4-c}^-$, $R^4SO_3$, $(R^4SO_2)_{3-c}^-$, or $(R^4SO_2)_2N^-$ but also perhalogenate ions (such as $ClO_4^-$ and $BrO_4^-$), halogenated sulfonate ions (such as $FSO_3^-$ and $ClSO_3^-$), sulfate ions (such as $CH_3SO_4^-$, $CF_3SO_4^-$, and $HSO_4^-$), carbonate ions (such as $HCO_3^-$ and $CH_3CO_3$), aluminate ions (such as $AlCl_4$ and $AlF_4$), hexafluoro bismuthate ion ($BiF_6^-$), carboxylate ions (such as $CH_3COO^-$, $CF_3COO^-$, $C_6H_5COO^-$, $CH_3C_6H_4COO^-$, $C_6F_5COO^-$, and $CF_3C_6H_4COO$), arylborate ions (such as $B(C_6H_5)_4^-$ and $CH_3CH_2CH_2CH_2B(C_6H_5)_3^-$), thiocyanate ion ($SCN^-$), and nitrate ion ($NO_3^-$).

The sulfonium salt may be produced by Production Process described below.

<Production Process>

An example of the production process includes a process shown by the reaction formula below (For example, the process disclosed by Jikken Kagaku Koza (Lectures of Experimental Chemistry), 4th Edition, vol. 24, p. 376, published by Maruzen Co., Ltd. (1992); JP-A No. 07-329399; JP-A No. 08-165290; JP-A No. 10-212286; or JP-A No. 10-7680.)

[Chemical Formula 3]

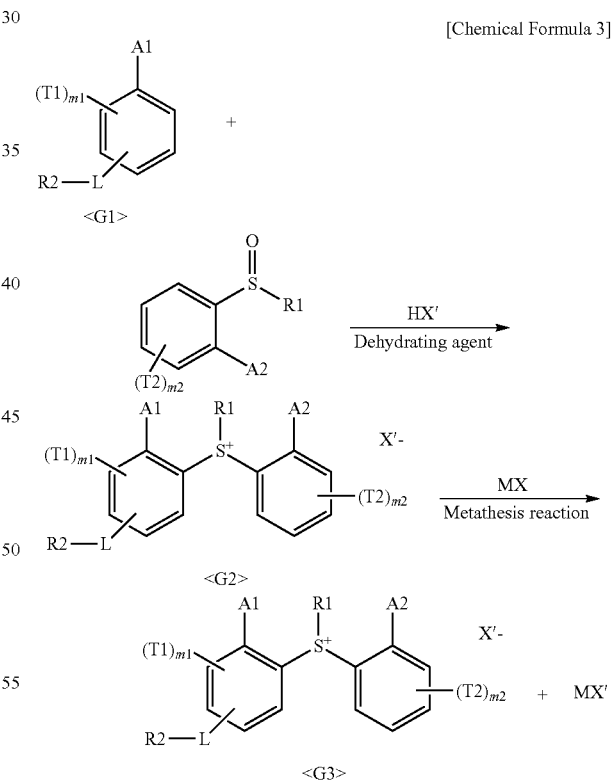

In the above reaction formula, R1, R2, A1, A2, T1, T2, L, S, O, $X^-$, m1 and m2 have the same definitions as those in general formula (1). H represents a hydrogen atom.

HX' represents the conjugate acid of a monovalent polyatomic anion. In view of availability, acid stability, and reaction yield, HX' is preferably methanesulfonic acid, perfluoroalkylsulfonic acid, or sulfuric acid.

The dehydrating agent represents, for example, phosphoric anhydride, acetic anhydride, concentrated sulfuric acid or perfluoroalkylsulfonic anhydride.

The monovalent polyatomic anion ($X^{t-}$) can be replaced with another anion ($X^-$) according to the present invention, for example, by a metathesis reaction as shown above.

MX represents a salt of an alkali metal (such as lithium, sodium, or potassium) cation with another anion according to the present invention (such as an anion represented by $MY_a^-$, $(Rf)_bPF_{6-b}^-$, $R^3_cBY_{4-c}^-$, $R^3_cGaY_{4-c}^-$, $R^4SO_3^-$, $(R^4SO_2)_3C^-$, or $(R^4SO_2)_2N^-$).

In the above reaction formula, the first step reaction may be performed in the absence of a solvent, or if necessary, may be performed in an organic solvent (such as acetonitrile, tetrahydrofuran, dioxane, ethanol, acetone, dichloromethane, and chloroform). The reaction temperature may be about 0 to 105° C.

The second step reaction may be performed continuously after the first step or performed after a reaction intermediate (G2) is isolated (and purified if necessary). The reaction intermediate (G2) is mixed and stirred with an aqueous solution of the salt (MX) of an alkali metal cation with an anion used in the present invention so that it is subjected to a metathesis reaction, and the precipitated solid is separated by filtration, or the separated oil product is extracted with an organic solvent, and the solvent is removed, so that the sulfonium salt of the present invention is obtained in the form of a solid or a viscous liquid. If necessary, the resulting solid or viscous liquid may be purified by washing with an appropriate organic solvent, recrystallization technique, or column chromatography.

The chemical structure of the sulfonium salt of the present invention can be identified by a common analysis method or methods (such as $^1H-$, $^{11}B-$, $^{13}C-$, $^{19}F-$, $^{31}P$-nuclear magnetic resonance spectroscopy, infrared absorption spectroscopy, and/or elemental analysis).

The photoacid generator of the present invention comprises the sulfonium salt represented by general formula (1), and may be used as it is or in combination with an additional conventionally known photoacid generator.

When an additional photoacid generator is contained, the content (% by mole) of the additional photoacid generator is preferably from 0.1 to 100, more preferably from 0.5 to 50, based on the total molar number of the sulfonium salt represented by general formula (1) of the present invention. Examples of the additional photoacid generator include conventionally known ones such as onium salts (such as sulfonium, iodonium, selenium, ammonium, and phosphonium) and salts of transition metal complex ions with anions.

The photoacid generator of the present invention may be previously dissolved in a solvent that does not inhibit polymerization, crosslinking reaction and deprotection reaction so that it can be easily dissolved in a cationically polymerizable compound or a chemically amplified photoresist composition.

Examples of the solvent include carbonates such as propylene carbonate, ethylene carbonate, 1,2-butylene carbonate, dimethyl carbonate, and diethyl carbonate; ketones such as acetone, methyl ethyl ketone, cyclohexanone, methyl isoamyl ketone, and 2-heptanone; polyhydric alcohols and derivatives thereof, such as monomethyl ethers, monoethyl ethers, monopropyl ethers, monobutyl ethers, or monophenyl ethers of ethylene glycol, ethylene glycol monoacetate, diethylene glycol, diethylene glycol monoacetate, propylene glycol, propylene glycol monoacetate, dipropylene glycol, and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanoate, 3-methoxybutyl acetate, 3-methyl-3-methoxybutyl acetate, β-propiolactone, β-butyrolactone, γ-butyrolactone, δ-valerolactone, and ε-caprolactone; and aromatic hydrocarbons such as toluene and xylene.

When a solvent is used, the amount of the solvent used is preferably from 15 to 1,000 parts by weight, more preferably from 30 to 500 parts by weight, based on 100 parts by weight of the photoacid generator comprising the sulfonium salt of the present invention. These solvents may be used alone or in combination of two or more.

The energy ray-curable composition of the present invention comprises the above photoacid generator and a cationically polymerizable compound.

Examples of the cationically polymerizable compound as a constituent of the energy ray-curable composition include cyclic ethers (such as epoxide and oxetane), ethylenically unsaturated compounds (such as vinyl ether and styrene), bicycloorthoesters, spiroorthocarbonates, and spiroorthoesters (such as those described in JP-A No. 11-060996, JP-A No. 09-302269, JP-A No. 2003-026993).

Known epoxides and the like may be used as epoxides, example of which include aromatic epoxides, alicyclic epoxides, and aliphatic epoxides.

Examples of the aromatic epoxides include glycidyl ethers of monohydric or polyhydric phenols having at least one aromatic ring (such as phenol, bisphenol A, phenol novolac, and alkylene oxide adducts thereof).

Examples of the alicyclic epoxides include compounds obtained by epoxidation of compounds having at least one cyclohexene or cyclopentene ring with an oxidizing agent (such as 3,4-epoxycyclohexylmethyl-3,4-epoxycyclohexanecarboxylate).

Examples of the aliphatic epoxides include polyglycidyl ethers of aliphatic polyhydric alcohols or alkylene oxide adducts thereof (such as 1,4-butanediol diglycidyl ether and 1,6-hexanediol diglycidyl ether), polyglycidyl esters of aliphatic polybasic acids (such as diglycidyl tetrahydrophthalate), and epoxidized long-chain unsaturated compounds (such as epoxidized soybean oil and epoxidized polybutadiene).

Known oxetanes and the like may be used as oxetanes, examples of which include 3-ethyl-3-hydroxymethyloxetane, 2-ethylhexyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, 1,4-bis[(3-ethyl-3-oxetanylmethoxy)methyl]benzene, oxetanylsilsesquioxetane, and phenol novolac oxetane.

Known cationically polymerizable monomers and the like may be used as ethylenically unsaturated compounds, examples of which include aliphatic monovinyl ethers, aromatic monovinyl ethers, polyfunctional vinyl ethers, styrenes, and cationically polymerizable nitrogen-containing monomers.

Examples of the aliphatic monovinyl ethers include methyl vinyl ether, ethyl vinyl ether, butyl vinyl ether, and cyclohexyl vinyl ether.

Examples of the aromatic monovinyl ethers include 2-phenoxyethyl vinyl ether, phenyl vinyl ether, and p-methoxyphenyl vinyl ether.

Examples of the polyfunctional vinyl ethers include butanediol-1,4-divinyl ether and triethylene glycol divinyl ether.

Examples of the styrenes include styrene, α-methylstyrene, p-methoxystyrene, and p-tert-butoxystyrene.

Examples of the cationically polymerizable nitrogen-containing monomers include N-vinylcarbazole and N-vinylpyrrolidone.

Examples of the bicycloorthoesters include 1-phenyl-4-ethyl-2,6,7-trioxabicyclo[2.2.2]octane and 1-ethyl-4-hydroxymethyl-2,6,7-trioxabicyclo[2.2.2]octane.

Examples of the spiroorthocarbonates include 1,5,7,11-tetraoxaspiro[5.5]undecane and 3,9-dibenzyl-1,5,7,11-tetraoxaspiro[5.5]undecane.

Examples of the spiroorthoesters include 1,4,6-trioxaspiro[4.4]nonane, 2-methyl-1,4,6-trioxaspiro[4.4]nonane, and 1,4,6-trioxaspiro[4.5]decane.

Additional example of the cationically polymerizable compound includes polyorganosiloxanes having at least one cationically polymerizable group in a molecule (such as those described in JP-A 2001-348482, Journal of Polym. Sci., Part A, Polym. Chem., Vol. 28,497 (1990)). These polyorganosiloxanes may be straight chain, branched chain, cyclic, or the mixture of these.

Among these cationically polymerizable compounds, epoxides, oxetanes, and vinyl ethers are preferred, epoxides and oxetane are more preferred, and alicyclic epoxides and oxetanes are particularly preferred. These cationically polymerizable compounds may be used alone or in combination of two or more.

The content of the photoacid generator comprising the sulfonium salt of the present invention in an energy ray-curable composition is preferably from 0.05 to 20 parts by weight, more preferably from 0.1 to 10 parts by weight, based on 100 parts by weight of the cationically polymerizable compound. Within the range, the cationically polymerizable compound can be more sufficiently polymerized, so that the physical properties of the cured product can be further improved. It will be understood that the content may be determined taking into account various factors such as the properties of the cationically polymerizable compound, the type and irradiation dose of the energy ray, the temperature, the curing time, the humidity, and the thickness of the coating film, and is not limited to the above range.

If necessary, the energy ray-curable composition of the present invention may contain known additives (such as a sensitizer, a pigment, a filler, an antistatic agent, a flame retardant, an anti-foaming agent, a fluidity controlling agent, a light stabilizer, an antioxidant, a tackifier, an ion scavenger, an anti-coloring agent, a solvent, a nonreactive resin, and a radically-polymerizable compound).

Known sensitizers (such as those described in JP-A No. 11-279212 and JP-A No. 09-183960) and the like may be used as such a sensitizer, examples of which include anthracenes (such as anthracene, 9,10-dibutoxyanthracene, 9,10-dimethoxyanthracene, 9,10-diethoxyanthracene, 2-ethyl-9,10-dimethoxyanthracene, and 9,10-dipropoxyanthracene); pyrene; 1,2-benzanthracene; perylene; tetracene; coronene; thioxanthones (such as thioxanthone, 2-methylthioxanthone, 2-ethylthioxanthone, 2-chlorothioxanthone, 2-isopropylthioxanthone, and 2,4-diethylthioxanthone); phenothiazine (such as phenothiazine, N-methylphenothiazine, N-ethylphenothiazine, and N-phenylphenothiazine); xanthone; naphthalenes {such as 1-naphthol, 2-naphthol, 1-methoxynaphthalene, 2-methoxynaphthalene, 1,4-dihydroxynaphthalene, and 4-methoxy-1-naphthol}; ketones (such as dimethoxyacetophenone, diethoxyacetophenone, 2-hydroxy-2-methyl-1-phenylpropan-1-one, 4'-isopropyl-2-hydroxy-2-methylpropiophenone, and 4-benzoyl-4'-methyldiphenylsulfide); carbazoles {such as N-phenylcarbazole, N-ethylcarbazole, poly-N-vinylcarbazole, and N-glycidylcarbazole}; chrysenes (such as 1,4-dimethoxychrysene and 1,4-di-α-methylbenzyloxychrysene); and phenanthrenes (such as 9-hydroxyphenanthrene, 9-methoxyphenanthrene, 9-hydroxy-10-methoxyphenanthrene, and 9-hydroxy-10-ethoxyphenanthrene).

When a sensitizer is contained, the content of the sensitizer is preferably from 1 to 300 parts by weight, more preferably from 5 to 200 parts by weight, based on 100 parts of the photoacid generator of the present invention.

Known pigments and the like may be used as pigments, examples of which include inorganic pigments (such as titanium oxide, iron oxide, and carbon black) and organic pigments (such as azo pigments, cyanine pigments, phthalocyanine pigments, and quinacridone pigments).

When a pigment is contained, the content of the pigment is preferably from 0.5 to 400,000 parts by weight, more preferably from 10 to 150,000 parts by weight, based on 100 parts of the photoacid generator of the present invention.

Known fillers and the like may be used as fillers, examples of which include fused silica, crystalline silica, calcium carbonate, aluminum oxide, aluminum hydroxide, zirconium oxide, magnesium carbonate, mica, talc, calcium silicate, and lithium aluminum silicate.

When a filler is contained, the content of the filler is preferably from 50 to 600,000 parts by weight, more preferably 300 to 200,000 parts by weight, based on 100 parts of the photoacid generator of the present invention.

Known antistatic agents and the like may be used as antistatic agents, examples of which include nonionic antistatic agents, anionic antistatic agents, cationic antistatic agents, ampholytic antistatic agents, and high molecular weight antistatic agents.

When an antistatic agent is contained, the content of the antistatic agent is preferably from 0.1 to 20,000 parts by weight, more preferably from 0.6 to 5,000 parts by weight, based on 100 parts of the photoacid generator of the present invention.

Known flame retardants and the like may be used as flame retardants, examples of which include inorganic flame retardants {such as antimony trioxide, antimony pentoxide, tin oxide, tin hydroxide, molybdenum oxide, zinc borate, barium metaborate, red phosphorus, aluminum hydroxide, magnesium hydroxide, and calcium aluminate); bromine flame retardants {such as tetrabromophthalic anhydride, hexabromobenzene, and decabromobiphenyl ether); and phosphate flame retardants (such as tris(tribromophenyl) phosphate).

When a flame retardant is contained, the content of the flame retardant is preferably from 0.5 to 40,000 parts by weight, more preferably from 5 to 10,000 parts by weight, based on 100 parts of the photoacid generator of the present invention.

Known anti-foaming agents and the like may be used as anti-foaming agents, examples of which include alcoholic anti-foaming agents, metallic soap anti-foaming agents, phosphate anti-foaming agents, fatty acid ester anti-foaming agents, polyether anti-foaming agents, silicone anti-foaming agents, and mineral oil anti-foaming agents.

Known fluidity controlling agents and the like may be used as fluidity controlling agents, examples of which include hydrogenated castor oil, oxidized polyethylene, organic bentonite, colloidal silica, amide wax, metallic soap, and acrylic ester polymers.

Known light stabilizers and the like may be used as light stabilizers, examples of which include ultraviolet absorbing stabilizers {such as benzotriazole, benzophenone, salicylates, cyanoacrylates, and derivatives thereof); radical scavenging stabilizers (such as hindered amines); and quenching stabilizers (such as nickel complexes).

Known antioxidants and the like may be used as antioxidants, examples of which include phenolic antioxidants (such as monophenolic, bisphenolic, and macromolecular phenolic antioxidants), sulfur-based antioxidants, and phosphorus-based antioxidants.

Known tackifiers and the like may be used as tackifiers, example of which include coupling agents, silane coupling agents, and titanium coupling agents.

Known ion scavenger and the like may be used as ion scavenger, examples of which include organoaluminum (such as alkoxyaluminum and phenoxyaluminum).

Known anti-coloring agents and the like may be used as anti-coloring agents, and antioxidants are generally effective, examples of which include phenolic antioxidants (such as monophenolic, bisphenolic, and macromolecular phenolic antioxidants), sulfur-based antioxidants, and phosphorus-based antioxidants. However, these anti-coloring agents do not have coloring prevention effect on heat resistance test at high temperature.

When an anti-foaming agent, a fluidity controlling agent, a light stabilizer, an antioxidant, a tackifier, an ion scavenger, or an anti-coloring agent is contained, the content of each material is preferably from 0.1 to 20,000 parts by weight, more preferably from 0.5 to 5,000 parts by weight, based on 100 parts of the photoacid generator of the present invention.

Any solvent that can be used to dissolve the cationically polymerizable compound or to control the viscosity of the energy ray-curable composition may be used as solvents, examples of which include those listed for the above photoacid generator.

When a solvent is contained, the content of the solvent is preferably from 50 to 2,000,000 parts by weight, more preferably from 200 to 500,000 parts by weight, based on 100 parts of the photoacid generator of the present invention.

Examples of the nonreactive resin include polyester, polyvinyl acetate, polyvinyl chloride, polybutadiene, polycarbonate, polystyrene, polyvinyl ether, polyvinyl butyral, polybutene, hydrogenated styrene-butadiene block copolymers, copolymers of (meth)acrylic acid esters, and polyurethane. The number average molecular weight of these resins is preferably from 1,000 to 500,000, more preferably from 5,000 to 100,000 (the number average molecular weight is a value measured by a general method such as GPC).

When a nonreactive resin is contained, the content of the nonreactive resin is preferably from 5 to 400,000 parts by weight, more preferably from 50 to 150,000 parts by weight, based on 100 parts of the photoacid generator of the present invention.

When a nonreactive resin is contained, it is preferably dissolved in advance in a solvent so that it can be easily dissolved in the cationically polymerizable compound or the like.

Known radically polymerizable compounds and the like may be used as radically polymerizable compounds {such as those described in "Photopolymer Handbook" edited by The Technical Association of Photopolymers, Japan (1989, Kogyo Chosakai Publishing, Co., Ltd.), "UV/EB Koka Gijutsu" (Technology of UV/EB Curing), edited by Sogo Gijutsu Center (1982, Sogo Gijutsu Center), and "UV/EB Koka Zairyo" (UV/EB Curable Materials), edited by RadTech Japan (1992, CMC), examples of which include monofunctional monomers, bifunctional monomers, polyfunctional monomers, epoxy (meth)acrylate, polyester (meth)acrylate, and urethane (meth)acrylate.

When a radically polymerizable compound is contained, the content of the radically polymerizable compound is preferably from 5 to 400,000 parts by weight, more preferably from 50 to 150,000 parts by weight, based on 100 parts of the photoacid generator of the present invention.

When a radically polymerizable compound is contained, a radical polymerization initiator initiating polymerization with heat or light is preferably used so that the compound can be polymerized by radical polymerization.

Known radical polymerization initiators and the like may be used as radical polymerization initiators, examples of which include thermal radical polymerization initiators (such as organic peroxides and azo compounds) and photo-radical polymerization initiators (such as acetophenone-based initiators, benzophenone-based initiators, Michler's ketone-based initiators, benzoin-based initiators, thioxanthone-based initiators, and acylphosphine-based initiators.

When a radical polymerization initiator is contained, the content of the radical polymerization initiator is preferably from 0.01 to 20 parts by weight, more preferably from 0.1 to 10 parts by weight, based on 100 parts of the radically polymerizable compound.

The energy ray-curable composition of the present invention may be prepared by uniformly mixing and dissolving the cationically polymerizable compound, the photoacid generator, and if necessary an optional additive(s) at room temperature (about 20 to 30° C.) or if necessary, under heating (about 40 to 90° C.), or by further kneading them with a triple-roll mill or the like.

The energy ray-curable composition of the present invention may be cured by irradiation with energy rays so that a cured product can be obtained.

The energy ray may be of any energy ray as long as it has an energy to induce the decomposition of the photoacid generator of the present invention, preferred examples of which include energy rays in the ultraviolet to visible light region (wavelength: from about 100 to about 800 nm) obtained from a low pressure-, medium pressure-, high pressure-, or ultra high pressure-mercury lamp, a metal halide lamp, an LED lamp, a xenon lamp, a carbon arc lamp, a fluorescent lamp, a semiconductor solid-state laser, an argon laser, a He—Cd laser, a KrF excimer laser, an ArF excimer laser, or an $F_2$ laser. Radiations with a high energy, such as electron beams or X-rays may also be used as the energy rays.

While the energy ray irradiation time is influenced by the intensity of the energy rays or the permeability of the energy rays to the energy ray-curable composition, an energy ray exposure time of about 0.1 to 10 seconds is enough at room temperature (about 20 to 30° C.). However, if the permeability of the energy rays is low or if the thickness of the energy ray-curable composition is large, for example, it is sometimes preferred to spend more time. Most energy ray-curable compositions are cured by cationic polymerization in 0.1 seconds to several minutes after the irradiation with energy rays. If necessary, however, post-curing may be performed by heating at a temperature of room temperature (about 20 to 30° C.) to 200° C. for several seconds to several hours after the irradiation with energy rays.

Specific applications of the energy ray-curable composition of the present invention include paints, coating agents, various coating materials (hard coats, anti-fouling coating materials, anti-fogging coating materials, anti-corrosion coating materials, optical fibers and the like), back surface treatment agents for adhesive tapes, release coating materials of release sheets for adhesive labels (release papers, release plastic films, release metal foils and the like), printing plates, ink compositions for dental materials (dental formulations and dental composites), ink compositions, inkjet ink compositions, positive resists (for formation of connection terminals and wiring patterns in production of electronic components such as circuit boards, CSP and MEMS elements), resist films, liquid resists and negative resists (permanent film materials of surface protecting films, interlayer dielectric films, and planarizing films for semiconductor elements), resists for MEMS, positive photosensitive materials, negative photosensitive materials, various adhesives (various temporary fixing agents for electronic components, adhesives for HDD, adhesives for pick-up lenses, adhesives for functional films for FPD (polarizing plates, antireflection films), holographic resins, FPD materials (color filters, black matrices, partition wall materials, photospacers, ribs, orientation films for liquid crystals, sealing agents for FPD and the like), optical members, molding materials (for building materials, optical components and lenses), casting materials, putty materials, glass fiber impregnating agents, fillers, sealing materials, sealants, photosemiconductor (LED) sealing materials, optical waveguide materials, nano-imprint materials, stereolithography materials, and micro-stereolithography materials.

The photoacid generator of the present invention, which can generate a strong acid upon irradiation with light, may also be used as a photoacid generator for known chemically amplified resist materials (such as those described in JP-A No. 2003-267968, JP-A No. 2003-261529, and JP-A No. 2002-193925).

Examples of the chemically amplified resist materials include (1) a two-component chemically amplified positive resist comprising, as essential ingredients, a photo-acid generator and a resin that can be made soluble in an alkali developing solution by the action of an acid; (2) a three-component chemically amplified positive resist comprising, as essential ingredients, a resin soluble in an alkali developing solution, a dissolution inhibitor that can be made soluble in an alkali developing solution by the action of an acid, and a photoacid generator, and (3) a chemically amplified negative resist comprising, as essential ingredients, a resin soluble in an alkali developing solution, a crosslinking agent that can crosslink the resin to make the resin insoluble in an alkali developing solution when heated in the presence of an acid, and a photoacid generator.

The chemically amplified positive photoresist composition of the present invention contains an ingredient (A) comprising the photoacid generator of the present invention, which is a compound generating an acid when the compound is irradiated with light or a radiation; and a resin ingredient (B) increasing its solubility in an alkali under the action of an acid.

In the chemically amplified positive photoresist composition of the present invention, the ingredient (A) may be used in combination with an additional known conventional photoacid generator. Examples of the additional photoacid generator include onium salt compounds, sulfone compounds, sulfonate compounds, sulfonimide compounds, disulfonyl diazomethane compounds, disulfonylmethane compounds, oxime sulfonate compounds, hydrazine sulfonate compounds, triazine compounds, and nitrobenzyl compounds, as well as organohalogen compounds and disulfone.

The additional known conventional photoacid generator is preferably at least one from the group of an onium compound, a sulfonimide compound, a diazomethane compound, and an oxime sulfonate compound.

When such an additional known conventional photoacid generator is used in combination, the amount of the additional photoacid generator used is generally from 10 to 900 parts by weight, preferably from 25 to 400 parts by weight, based on 100 parts by weight of the total amount of the sulfonium salts represented by general formula (1) described above, although the amount thereof may be arbitrary.

The content of the above ingredient (A) is preferably from 0.05 to 5% by weight, in the solids of the chemically amplified positive photoresist composition.

<Resin Ingredient (B) Increasing its Solubility in an Alkali Under the Action of an Acid>

The aforesaid "resin (B) increasing its solubility in an alkali under the action of an acid" (hereinafter referred to as "ingredient (B)" in the description), which is used in the chemically amplified positive photoresist composition of the present invention, is at least one resin selected from the group consisting of a novolac resin (B1), a polyhydroxystyrene resin (B2), and an acrylic resin (B3), or a mixture thereof, or a copolymer thereof.

[Novolac Resin (B1)]

The novolac resin (B1) to be used may be a resin represented by general formula (bi) described below.

[Chemical Formula 4]

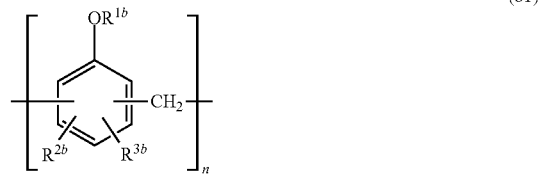

In general formula (bl) described above, $R^{1b}$ represents an acid-dissociating solubility-inhibiting group, $R^{2b}$ and $R^{3b}$ each independently represent a hydrogen atom or an alkyl group having 1 to 6 carbon atoms, and n represents the number of repeating units of the structure in the parentheses.

The above acid-dissociating solubility-inhibiting group represented by $R^{1b}$ is preferably a straight chain alkyl group having 1 to 6 carbon atoms, a branched chain alkyl group having 3 to 6 carbon atoms, a cyclic alkyl group having 3 to 6 carbon atoms, a tetrahydropyranyl group, a tetrahydrofuranyl group, or a trialkylsilyl group.

Specific examples of the above acid-dissociating solubility-inhibiting group represented by $R^{1b}$ include a methoxyethyl group, an ethoxyethyl group, a n-propoxyethyl group, an isopropoxyethyl group, a n-butoxyethyl group, an isobutoxyethyl group, a tert-butoxyethyl group, a cyclohexyloxyethyl group, a methoxypropyl group, an ethoxypropyl group, a 1-methoxy-1-methyl-ethyl group, a 1-ethoxy-1-methyl-ethyl group, a tert-butoxycarbonyl group, a tert-butoxycarbonylmethyl group, a trimethylsilyl group, and a tri-tert-butyldimethylsilyl group.

[Polyhydroxystyrene Resin (B2)]

The polyhydroxystyrene resin (B2) to be used may be a resin represented by general formula (b4) described below.

[Chemical Formula 5]

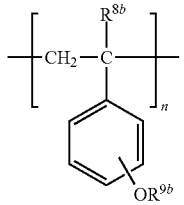

(b4)

In general formula (b4) described above, $R^1$ represents a hydrogen atom or an alkyl group having 1 to 6 carbon atoms, $R^{9b}$ represents an acid-dissociating solubility-inhibiting group, and n represents the number of repeating units of the structure in the parentheses.

The above alkyl group having 1 to 6 carbon atoms may be a straight chain alkyl group having 1 to 6 carbon atoms, a branched chain alkyl group having 3 to 6 carbon atoms, or a cyclic alkyl group having 3 to 6 carbon atoms. Specifically, it may be a methyl group, an ethyl group, a propyl group, an isopropyl group, a n-butyl group, an isobutyl group, a tert-butyl group, a pentyl group, an isopentyl group, or a neopentyl group, and the cyclic alkyl group may be a cyclopentyl group or a cyclohexyl group.

Examples of the above acid-dissociating solubility-inhibiting group represented by $R^{9b}$ which may be used include those listed for $R^{1b}$ described above.

The polyhydroxystyrene resin (B2) may further comprise, as a structural unit, an additional polymerizable compound for properly controlling the physical and chemical properties. Such a polymerizable compound may be a known radically polymerizable or anionically polymerizable compound. Examples thereof include monocarboxylic acids such as acrylic acid; dicarboxylic acids such as maleic acid, fumaric acid, and itaconic acid; methacrylic acid derivatives having a carboxyl group and an ester bond, such as 2-methacryloyloxyethylsuccinic acid, alkyl (meth)acrylates such as methyl (meth)acrylate; hydroxyalkyl (meth)acrylates such as 2-hydroxyethyl (meth)acrylate; dicarboxylic acid diesters such as diethyl maleate; vinyl group-containing aromatic compounds such as styrene and vinyl toluene; vinyl group-containing aliphatic compounds such as vinyl acetate; conjugated diolefins such as butadiene and isoprene; nitrile group-containing polymerizable compounds such as acrylonitrile; chlorine-containing polymerizable compounds such as vinyl chloride; and amide bond-containing polymerizable compounds such as acrylamide.

[Acrylic Resin (B3)]

The acrylic resin (B3) to be used may be any of resins represented by general formulae (M5) to (b10) described below.

[Chemical Formula 6]

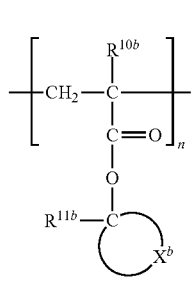

(b5)

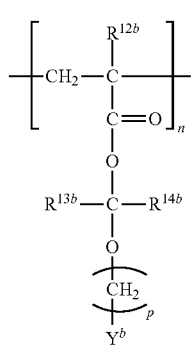

(b6)

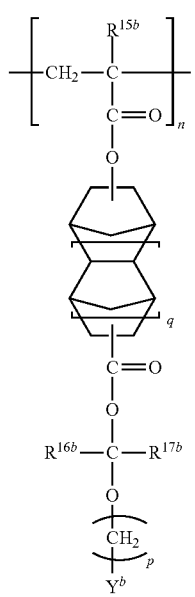

(b7)

[Chemical Formula 7]

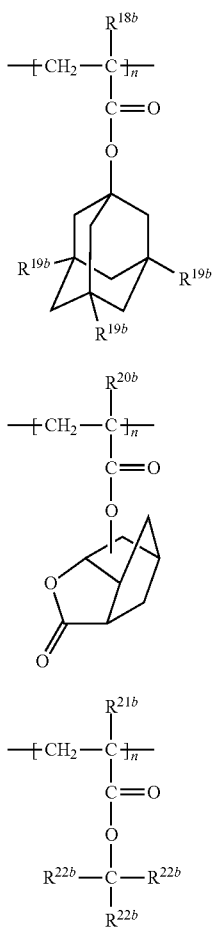

In general formulae (b5) to (b7) described above, $R^{10b}$ to $R^{17b}$ each independently represent a hydrogen atom, a straight chain alkyl group having 1 to 6 carbon atoms, a branched chain alkyl group having 3 to 6 carbon atoms, a fluorine atom, a straight chain fluorinated alkyl group having 1 to 6 carbon atoms, or a branched chain fluorinated alkyl group having 3 to 6 carbon atoms, $X^b$ represents a moiety that forms a hydrocarbon ring of 5 to 20 carbon atoms with the carbon atom bonded to the moiety, $Y^b$ represents an optionally substituted aliphatic cyclic group or an optionally substituted alkyl group, n represents the number of repeating units of the structure in the parentheses, p represents an integer of 0 to 4, and q represents 0 or 1.

In general formulae (b8), (b9), and (b10), $R^{18b}$, $R^{20b}$, and $R^{21b}$ each independently represent a hydrogen atom or a methyl group. In general formula (b8), each occurrence of $R^{9b}$ independently represents a hydrogen atom, a hydroxyl group, a cyano group, or a $COOR^{23b}$ group (wherein $R^{23b}$ represents a hydrogen atom, a straight chain alkyl group having 1 to 4 carbon atoms, a branched chain alkyl group having 3 to 4 carbon atoms, or a cycloalkyl group having 3 to 20 carbon atoms). In general formula (b10), each occurrence of $R^{22b}$ independently represents a monovalent alicyclic hydrocarbon group having 4 to 20 carbon atoms or a derivative thereof, a straight chain alkyl group having 1 to 4 carbon atoms, or a branched chain alkyl group having 3 to 4 carbon atoms, wherein at least one of $R^{22b}$ is the alicyclic hydrocarbon group or a derivative thereof, or any two of $R^{22b}$, together with the common carbon atom to which they are each bonded, join to form a bivalent alicyclic hydrocarbon group having 4 to 20 carbon atoms or a derivative thereof, and the remaining $R^{22b}$ moieties are a straight chain alkyl group having 1 to 4 carbon atoms, a branched chain alkyl group having 3 to 4 carbon atoms, or a monovalent alicyclic hydrocarbon group having 4 to 20 carbon atoms or a derivative thereof.

Among the above ingredients (B), the acrylic resin (B3) is preferably used.

The polystyrene-equivalent weight average molecular weight of the ingredient (B) is preferably from 10,000 to 600,000, more preferably from 50,000 to 600,000, even more preferably from 230,000 to 550,000. When it has such a weight average molecular weight, the resist resin can have excellent physical properties.

The ingredient (B) is also preferably a resin with a dispersity of 1.05 or more. As used herein, the term "dispersity" refers to a value obtained by dividing the weight average molecular weight by the number average molecular weight. When the dispersity is such a value, the resist can have high plating resistance and the resist resin can have excellent physical properties.

The content of the above ingredient (B) is preferably from 5 to 60% by weight, in the solids of the chemically amplified positive photoresist composition.

<Alkali-Soluble Resin (C)>

The chemically amplified positive photoresist composition of the present invention preferably further contains an alkali-soluble resin (referred to as "ingredient (C)" in the description) for improving the physical properties of the resist resin. The ingredient (C) is preferably at least one selected from the group consisting of a novolac resin, a polyhydroxystyrene resin, an acrylic resin, and a polyvinyl resin.

The content of the above ingredient (C) is preferably from 5 to 95 parts by weight, more preferably from 10 to 90 parts by weight, based on 100 parts by weight of the above ingredient (B). When it is 5 parts by weight or more, the physical properties of the resist resin can be improved, and if it is 95 parts by weight or less, film loss during development will tend to be prevented.

<Acid Diffusion Controlling Agent (D)>

The chemically amplified positive photoresist composition of the present invention preferably further contains an acid diffusion controlling agent (D) (referred to as "ingredient (D)" in the description) for improving the shape of the resist pattern and post exposure delay time stability. The ingredient (D) is preferably a nitrogen-containing compound, and if necessary, may contain an organic carboxylic acid, or a phosphorous oxo acid or a derivative thereof.

The chemically amplified positive photoresist composition of the present invention may further contain an adhesion auxiliary agent for improving adhesion to the substrate. A functional silane coupling agent is preferable as the adhesion auxiliary agent to be used.

The chemically amplified positive photoresist composition of the present invention may further contain a surfactant for improving coating properties, anti-foaming properties, leveling properties, or the like.

The chemically amplified positive photoresist composition of the present invention may further contain an acid, an acid anhydride, or a high-boiling-point solvent for fine adjustment of its solubility in an alkali developing solution.

The chemically amplified positive photoresist composition of the present invention, which does not basically need a sensitizer, may also contain a sensitizer for complementing the sensitivity, if necessary. A known conventional sensitizer may be used as such a sensitizer, specific examples of which include aforesaid sensitizers.

The amount of the sensitizer used may be from 5 to 500 parts by weight, preferably from 10 to 300 parts by weight, based on 100 parts by weight of the total amount of the sulfonium salts represented by general formula (1) described above.

Also, the chemically amplified positive photoresist composition of the present invention may appropriately contain an organic solvent for adjusting viscosity. Specific examples of the organic solvent include aforesaid solvents.

The amount of the organic solvent used is preferably in such a range that the solids content of the chemically amplified positive photoresist composition of the present invention is 30% by weight or more so that a photoresist layer with a thickness of 5 μm or more is obtained using the composition (for example, by spin coating).

For example, the chemically amplified positive photoresist composition of the present invention can be prepared only by mixing or stirring the above ingredients using a conventional method, and if necessary, the ingredients may be dispersed or mixed using a disperser such as a dissolver, a homogenizer, or a three-roll mill. After the mixing, the product may be further filtered using a mesh, a membrane filter, or the like.

The chemically amplified positive photoresist composition of the present invention is suitable for forming a photoresist layer with a thickness of generally 5 to 150 μm, more preferably 10 to 120 μm, even more preferably 10 to 100 μm, on a support. The resulting photoresist laminate comprises the support and a photoresist layer that is placed on the support and comprises the chemically amplified positive photoresist composition of the present invention.

The support is not particularly limited, and any known conventional support may be used, examples of which include a substrate for electronic parts and a product produced by forming a given wiring pattern on the substrate. Examples of such a substrate include a substrate made of silicon, silicon nitride, or metal such as titanium, tantalum, palladium, titanium-tungsten, copper, chromium, iron, or aluminum, and a glass substrate. In particular, the use of the chemically amplified positive photoresist composition of the present invention makes it possible to successfully form a resist pattern even on a copper substrate. Examples of materials that may be used for wiring pattern include copper, solder, chromium, aluminum, nickel, and gold.

For example, the above photoresist laminate may be produced as described below. Specifically, a solution of the chemically amplified positive photoresist composition prepared as described above is applied to the support, and the solvent is removed by heating, so that a desired coating film is formed. The application to the support may be performed by spin coating, slit coating, roll coating, screen printing, applicator method, or any other application method. The coating film of the composition of the present invention may be prebaked under the conditions of generally 70 to 150° C., preferably 80 to 140° C., and about 2 to 60 minutes, which depend on the type or formulation rate of each ingredient in the composition, the thickness of the coating, or the like.

The thickness of the photoresist layer may be generally in the range of 5 to 150 μm, preferably 10 to 120 μm, more preferably 10 to 100 μm.

In order to form a resist pattern using the photoresist laminate obtained as described above, the resulting photoresist layer may be site-selectively irradiated with (or exposed to) light or a radiation, such as an ultraviolet ray or visible light with a wavelength of 300 to 500 nm.

As used herein, "light" may be of any type activating the acid generator to generate an acid and are intended to include ultraviolet rays, visible light, or far ultraviolet rays, and "radiations" means X-rays, electron beams, ion beams, or the like. Examples of sources for light or radiations that may be used include low-pressure mercury lamps, high-pressure mercury lamps, ultra high-pressure mercury lamps, metal halide lamps, argon gas lasers, and LED lamps. The irradiation dose may be from 50 to 10,000 mJ/cm$^2$, for example, when an ultra high-pressure mercury lamp is used, although the irradiation dose depends on the type or formulation amount of each ingredient in the composition, the thickness of the coating film, or the like.

After the exposure, heating is performed using a known method to enhance the diffusion of the acid, so that the alkali solubility of the exposed part of the photoresist layer is changed. Subsequently, the unnecessary part is dissolved or removed, for example, using a given alkaline aqueous solution as a developer, so that a desired resist pattern is obtained.

While the development time depends on the type or formulation rate of each ingredient in the composition, or the dry coating thickness of the composition, it is generally from 1 to 30 minutes. The development method may be any of a puddle development method, a dipping method, a puddle method, and a spray development method. After the development, washing with flowing water is performed for 30 to 90 seconds, and drying is performed using an air gun, an oven, or the like.

A conductor such as a metal is embedded, for example, by plating or the like, in the non-resist part (where the resist has been removed using the alkali developing solution) of the resist pattern obtained as described above so that a joining terminal such as a metal post or bump can be formed. The plating method is not particularly restricted, and various known conventional plating methods may be used. The plating solution to be used is preferably a solder, copper, gold, or nickel plating solution. The remaining resist pattern is finally removed by a conventional method using a liquid stripper or the like.

The chemically amplified positive photoresist composition of the present invention may also be used to form a dry film. Such a dry film comprises a layer comprising the chemically amplified positive photoresist composition of the present invention; and protective films formed on both sides of the layer. The layer comprising the chemically amplified positive photoresist composition may generally have a thickness in the range of 10 to 150 μm, preferably 20 to 120 μm, more preferably 20 to 80 μm. The protective films are not particularly restricted, and resin films that have been used in conventional dry films may be used. In one case, one may be a polyethylene terephthalate film, and the other may be one selected from the group consisting of a polyethylene terephthalate film, a polypropylene film, and a polyethylene film.

For example, the chemically amplified positive dry film as described above may be produced as described below. Specifically, a solution of the chemically amplified positive photoresist composition prepared as described above is applied to one of the protective films, and the solvent is removed by heating, so that a desired coating film is formed. The drying conditions may be generally 60 to 100° C. and about 5 to 20 minutes, although they depend on the type or formulation rate of each ingredient in the composition, the thickness of the coating film, or the like.

A process of forming a resist pattern using the chemically amplified dry film obtained as described above may include stripping off one of the protective films from the chemically amplified positive dry film, laminating the resulting film on a support in such a manner that the exposed surface faces the above support side, so that a photoresist layer is obtained, then performing prebaking to dry the resist, and then stripping off the other protective film.

The resulting photoresist layer provided on the support in such a manner may be subjected to the same process as described above for the photoresist layer formed by direct application to the support so that a resist pattern can be formed.

The chemically amplified negative photoresist composition of the present invention contains an ingredient (E) comprising the photoacid generator of the present invention, which is a compound generating an acid when irradiated with light or a radiation; an alkali-soluble resin (F) having a phenolic hydroxyl group; and a crosslinking agent (G).

Alkali-Soluble Resin (F) Having Phenolic Hydroxyl Group

In the present invention, examples of the "alkali-soluble resin having a phenolic hydroxyl group" (hereinafter referred to as "phenolic resin (F)"), which may be used, include a novolac resin, polyhydroxystyrene, a polyhydroxystyrene copolymer, a copolymer of hydroxystyrene and styrene, a copolymer of hydroxystyrene, styrene, and a (meth)acrylic acid derivative, a phenol-xylylene glycol condensate resin, a cresol-xylylene glycol condensate resin, and a phenol-dicyclopentadiene condensate resin. Among them, preferred are a novolac resin, polyhydroxystyrene, a polyhydroxystyrene copolymer, a copolymer of hydroxystyrene and styrene, a copolymer of hydroxystyrene, styrene, and a (meth)acrylic acid derivative, and a phenol-xylylene glycol condensate resin. These phenolic resins (F) may be used alone or in a mixture of two or more.

The phenolic resin (F) may also contain a low-molecular-weight phenolic compound as a partial component.

Examples of the above low-molecular-weight phenolic compound include 4,4'-dihydroxydiphenylmethane and 4,4'-dihydroxydiphenyl ether.

Crosslinking Agent (G)

In the present invention, the "crosslinking agent" (hereinafter also referred to as "crosslinking agent (G)") is not particularly limited as long as it acts as a crosslinking component (curing component) reactive with the aforesaid phenolic resin(F). Examples of the above crosslinking agent (G) include a compound having at least two alkyl-etherified amino groups in the molecule, a compound having at least two alkyl-etherified benzene skeletons in the molecule, an oxirane ring-containing compound, a thiirane ring-containing compound, an oxetanyl group-containing compound, and an isocyanate group-containing compound (including a blocked derivative).

Among these crosslinking agents (G), preferred are a compound having at least two alkyl-etherified amino groups in the molecule or an oxirane ring-containing compound. More preferably, a compound having at least two alkyl-etherified amino groups in the molecule is used in combination with an oxirane ring-containing compound.

In the present invention, the amount of the crosslinking agent (G) formulated is preferably from 1 to 100 parts by weight, more preferably from 5 to 50 parts by weight, based on 100 parts by weight of the aforesaid phenolic resin (F). When the amount of the crosslinking agent (G) formulated is from 1 to 100 parts by weight, the curing reaction can sufficiently proceed, so that the resulting cured product can have a good pattern shape with a high resolution and have excellent heat resistance and electric insulation, which is preferred.

When a compound having alkyl-etherified amino groups is used in combination with an oxirane ring-containing compound, the content rate of the oxirane ring-containing compound is preferably 50% by weight or less, more preferably from 5 to 40% by weight, in particular, preferably from 5 to 30% by weight, based on the total amount of the compound having alkyl-etherified amino groups and the oxirane ring-containing compound, which is normalized as 100% by weight.

In this case, the resulting cured film also has excellent chemical resistance without losing the high resolution, which is preferred.

Crosslinked Fine Particles (H)

The chemically amplified negative photoresist composition of the present invention may further contain crosslinked fine particles (hereinafter also referred to as "crosslinked fine particles (H)") for improving the durability and thermal shock resistance of the resulting cured product.

The average particle size of the crosslinked fine particles (H) is generally from 30 to 500 nm, preferably from 40 to 200 nm, more preferably from 50 to 120 nm.

A method of controlling the particle size of the crosslinked fine particles (H) is not particularly limited. For example, when the crosslinked fine particles are synthesized by emulsion polymerization, the number of micelles during the emulsion polymerization may be controlled by the amount of the emulsifying agent used so that the particle size can be controlled.

The average particle size of the crosslinked fine particles (H) is a value obtained by a process that includes diluting a dispersion of the crosslinked fine particles by a conventional method and measuring the dilution with a light scattering particle size analyzer or the like.

The amount of the crosslinked fine particles (H) formulated is preferably from 0.5 to 50 parts by weight, more preferably from 1 to 30 parts by weight, based on 100 parts by weight of the aforesaid phenolic resin (F). When the amount of the crosslinked fine particles (H) is from 0.5 to 50 parts by weight, they have excellent compatibility with other ingredients or excellent dispersibility, so that the resulting cured film can have improved thermal shock resistance and heat resistance.

Adhesion Auxiliary Agent

The chemically amplified negative photoresist composition of the present invention may also contain an adhesion auxiliary agent for improving adhesion to the base material.

Examples of the above adhesion auxiliary agent include functional silane coupling agents having a reactive substituent such as a carboxyl group, a methacryloyl group, an isocyanate group, or an epoxy group.

The amount of the adhesion auxiliary agent formulated is preferably from 0.2 to 10 parts by weight, more preferably from 0.5 to 8 parts by weight, based on 100 parts by weight of the aforesaid phenolic resin (F). When the amount of the adhesion auxiliary agent formulated is from 0.2 to 10 parts by weight, excellent storage stability and good adhesion can be achieved, which is preferred.

Solvent

The chemically amplified negative photoresist composition of the present invention may also contain a solvent for improving the handleability of the resin composition or controlling viscosity or storage stability.

Specific examples of the above solvent include, but are not particularly limited to, those listed above.

The chemically amplified negative photoresist composition of the present invention, may also contain a sensitizer, if necessary. A known conventional sensitizer may be used as such a sensitizer, specific examples of which include aforesaid sensitizers.

The amount of the sensitizer used may be from 5 to 500 parts by weight, preferably from 10 to 300 parts by weight, based on 100 parts by weight of the total amount of the sulfonium salts represented by general formula (1) described above.

If necessary, the chemically amplified negative photoresist composition of the present invention may also contain an additional additive in such an extent that the characteristics of the invention are not impaired. Examples of such an additional additive include an inorganic filler, a quencher, a leveling agent, and a surfactant.

A method for preparing the chemically amplified negative photoresist composition of the present invention is not particularly limited, and it may be prepared by any known method. The composition may also be prepared by placing each ingredient in a sample vial, completely sealing the vial with a plug, and stirring the ingredients on a wave rotor.

The cured product of the present invention comprises a product obtained by curing the aforesaid chemically amplified negative photoresist composition.

The chemically amplified negative photoresist composition of the present invention described above has high remaining thickness ratio and excellent resolution, and the cured product has excellent electric insulation, thermal shock resistance and the like. Therefore, the cured product is suitable for use as a surface protecting film, a planarizing film, an interlayer dielectric film material, or the like in electronic components such as semiconductor devices and semiconductor packages.

To form the cured product of the present invention, the chemically amplified negative photoresist composition of the present invention as described above is first applied to a support (such as a resin-bearing copper foil, a copper-clad laminate, a silicon wafer having a sputtered metal film, or an alumina substrate), and the solvent and the like are evaporated by drying, so that a coating film is formed. Subsequently, the coating film is exposed to light through a desired mask pattern and heat-treated (hereinafter the heat treatment is referred to as "PEB") so that the reaction between the phenolic resin (F) and the crosslinking agent (G) is accelerated. The unexposed part is then dissolved and removed by development with an alkaline developing solution, so that a desired pattern is obtained. Heat treatment for producing insulating film characteristics is further performed, so that a cured film is obtained.

An application method such as dipping, spraying, bar coating, roller coating, or spin coating may be used to apply the resin composition to the support. The thickness of the coating film can be appropriately controlled by controlling application means or the solids content or viscosity of a solution of the composition.

Examples of radiations for use in the exposure include ultraviolet rays from low-pressure mercury lamps, high-pressure mercury lamps, metal halide lamps, g-line steppers, h-line steppers, i-line steppers, gh-line steppers, or ghi-line steppers, electron beams, and laser beams. The exposure dose is appropriately selected depending on the light source used, the thickness of the resin film, or the like. For example, in the case of ultraviolet irradiation from a high-pressure mercury lamp, the exposure dose may be from about 100 to 50,000 $J/m^2$ for a resin film thickness of 1 to 50 μm.

After the exposure, the above PEB treatment is performed to accelerate the curing reaction between the phenolic resin (F) and the crosslinking agent (G), which is induced by the generated acid. The PEB conditions are generally 70 to 150° C., preferably 80 to 120° C., and about 1 to 60 minutes, although they depend on the amount of the resin composition formulated, the thickness of the film used, or the like. Subsequently, the unexposed part is dissolved and removed by development with an alkaline developing solution, so that a desired pattern is formed. In this case, the development method may be a shower development method, a spray development method, an immersion development method, a puddle development method, or the like. The development conditions are generally 20 to 40° C. and about 1 to 10 minutes.

After the development, the film may be sufficiently cured by heat treatment so that insulting film characteristics can be sufficiently exerted. The curing conditions are not restricted. Depending on the intended use of the cured product, the composition may be cured by heating at a temperature of 50 to 250° C. for about 30 minutes to 10 hours. Two-stage heating may also be performed so that the curing can sufficiently proceed or deformation of the resulting pattern shape can be prevented. For example, the curing at the first stage may be performed by heating at a temperature of 50 to 120° C. for about 5 minutes to 2 hours, and the curing at the second state may be performed at a temperature of 80 to 250° C. for about 10 minutes to 10 hours. Under such curing conditions, a general oven, an infrared furnace, or the like can be used as the heating equipment.

EXAMPLES

Hereinafter, the invention is more specifically described with reference to Examples, which however are not intended to limit the invention. Hereinafter, "parts" means parts by weight.

Production Example 1

Synthesis of 4-[(2-tert-butylphenyl)thio]biphenyl

Mixed were 3.0 parts of 4-bromo-biphenyl, 1.9 parts of 2-tert-butylthiophenol, 1.2 parts of potassium hydroxide (purity 85%), and 7.0 parts of N-methylpyrrolidone, and stirred at 120° C. for 1 hour, and dissolved uniformly, and then allowed to react at 180° C. for 5 hours. The reaction solution was cooled to room temperature (about 25° C.) and then added 7.0 parts of dichloromethane, and dissolved. The dichloromethane layer was washed with 6.5 parts of ion-exchanged water until the pH became neutral. The dichloromethane layer was transferred to a rotary evaporator, and the solvent was removed by distillation. Then, added 20 parts of isopropanol to the residue, and heated at 70° C., and dissolved uniformly. Then the solution was cooled to room temperature, and allowed to precipitate crystal. The crystal was filtered, so that 4-[(2-tert-butylphenyl)thio]biphenyl was obtained in a yield of 80%. The product was identified by $^1$H-NMR.

Production Example 2

Synthesis of 4-[(2-tert-butylphenyl)thio]benzophenone

4-[(2-tert-butylphenyl)thio]benzophenone was obtained in a yield of 84% as in Production Example 1, except that "3.0 parts of 4-bromo-biphenyl" was replaced with "3.0 parts of 4-bromo benzophenone". The product was identified by $^1$H-NMR.

Production Example 3

Synthesis of 4-[(2-tert-butoxyphenyl)thio]benzophenone

4-[(2-tert-butoxyphenyl)thio]benzophenone was obtained in a yield of 65% as in Production Example 2, except that "1.9 parts of 2-tert-butylthiophenol" was replaced with "2.2 parts of 2-tert-butoxythiophenol". The product was identified by $^1$H-NMR.

Production Example 4

Synthesis of 4-[(2-trimethylsiloxyphenyl)thio]benzophenone

4-[(2-trimethylsiloxyphenyl)thio]benzophenone was obtained in a yield of 70% as in Production Example 2, except that "1.9 parts of 2-tert-butylthiophenol" was replaced with "2.7 parts of 2-trimethylsiloxythiophenol", and that "1.2 parts of potassium hydroxide (purity 85%)" was replaced with "1.5 parts of potassium hydroxide (purity 85%)". The product was identified by $^1$H-NMR.

Production Example 5

Synthesis of 4-[(5-tert-butyl-2-methylphenyl)thio]benzophenone

4-[(5-tert-butyl-2-methylphenyl)thio]benzophenone was obtained in a yield of 87% as in Production Example 2, except that "1.9 parts of 2-tert-butylthiophenol" was replaced with "2.7 parts of 5-tert-butyl-2-methylthiophenol". The product was identified by $^1$H-NMR.

Production Example 6

Synthesis of 2-[(5-tert-butyl-2-methylphenyl)thio]anthraquinone

2-[(5-tert-butyl-2-methylphenyl)thio]anthraquinone was obtained in a yield of 68% as in Production Example 5, except that "3.0 parts of 4-bromo benzophenone" was replaced with "3.1 parts of 2-chloroanthraquinone". The product was identified by $^1$H-NMR.

Production Example 7

Synthesis of 4-[(5-tert-butyl-2-methylphenyl)thio]phenylphenylsulfone

4-[(5-tert-butyl-2-methylphenyl)thio]phenylphenylsulfone was obtained in a yield of 70% as in Production Example 5, except that "3.0 parts of 4-bromobenzophenone" was replaced with "3.0 parts of 4-bromo phenylphenylsulfone". The product was identified by $^1$H-NMR.

Example 1

Synthesis of compound P1-TF

[Chemical Formula 8]

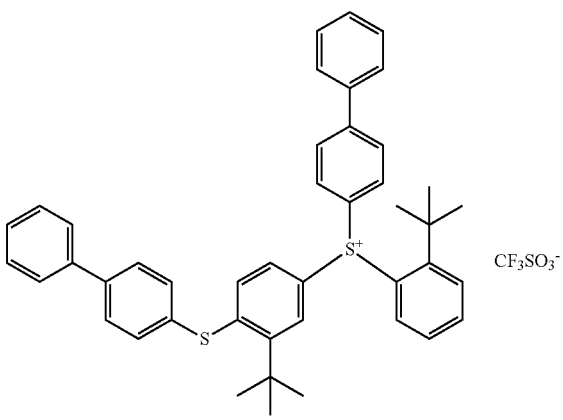

(P1-TF)

Uniformly mixed were 3.0 parts of 4-[(2-tert-butylphenyl)thio]biphenyl produced in Production Example 1, 10 parts of acetonitrile, 0.04 parts of sulfuric acid, and 0.40 parts of aqueous 35% hydrogen peroxide solution, and then allowed to react at 65° C. for 3 hours. The reaction solution was transferred to a rotary evaporator, and the solvent was removed by distillation, so that a mixture of 48% of 4-[(2-tert-butylphenyl)sulfinyl]biphenyl and 52% of 4-[(2-tert-butylphenyl)thio]biphenyl was obtained. The content of the mixture was calculated from the peak area ratio obtained by HPLC analysis. Dissolved was the mixture in 15 parts of dichloromethane, and added dropwise 1.6 parts of trifluoromethanesulfonic anhydride into the solution. The reaction solution was stirred at room temperature for 1 hour, and washed with 15 parts of water. The operation of washing the reaction solution was performed repeatedly until the pH of the water layer became neutral. Then added was 15 parts of hexane into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation, so that compound P1-TF was obtained in a yield of 55%. The product was identified by $^1$H-NMR, $^{19}$F-NMR and LC-MS.

Example 2

Synthesis of Compound P1-SB

[Chemical Formula 9]

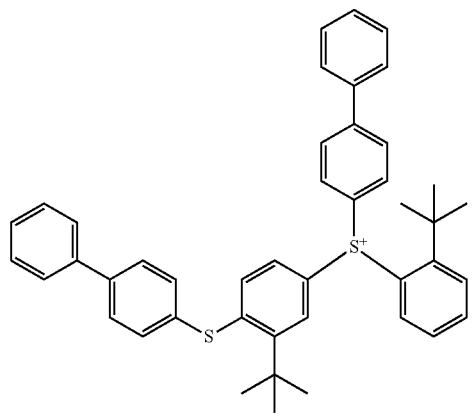

(P1-SB)

Dissolved was 1.0 part of compound P1-TF produced in Example 1 in 5.8 parts of dichloromethane, and added 0.4 parts of potassium hexafluoroantimonate and 5.1 parts of ion-exchanged water into the dichloromethane solution, and stirred at room temperature for 1 hour. Washed the organic layer with 5 parts of ion-exchanged water, and transferred to a rotary evaporator, and the solvent was removed by distillation, so that compound P1-SB was obtained in a yield of 95%. The product was identified by $^1$H-NMR and $^{19}$F-NMR.

Example 3

Synthesis of Compound P1-FP

[Chemical Formula 10]

(P1-FP)

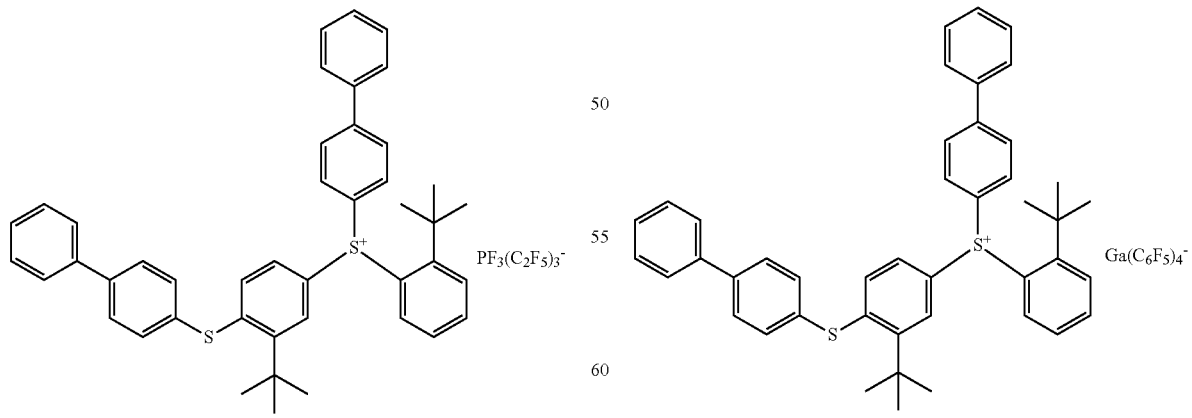

Compound P1-FP was obtained in a yield of 94% as in Example 2, except that "0.4 parts of potassium hexafluoroantimonate" was replaced with "0.65 parts of potassium tris(pentafluoroethyl)trifluorophosphate".

Example 4

Synthesis of Compound P1-B

[Chemical Formula 11]

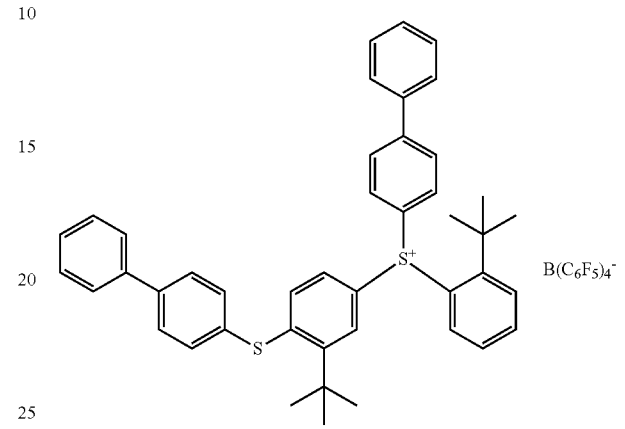

(P1-B)

Compound P1-B was obtained in a yield of 95% as in Example 2, except that "0.4 parts of potassium hexafluoroantimonate" was replaced with "0.90 parts of sodium tetrakis(pentafluoropheyl)borate".

Example 5

Synthesis of Compound P1-GA

[Chemical Formula 12]

(P1-GA)

Compound P1-GA was obtained in a yield of 95% as in Example 2, except that "0.4 parts of potassium hexafluoroantimonate" was replaced with "0.95 parts of sodium tetrakis(pentafluoropheyl) gallate".

Example 6

Synthesis of Compound P2-FP

[Chemical Formula 13]

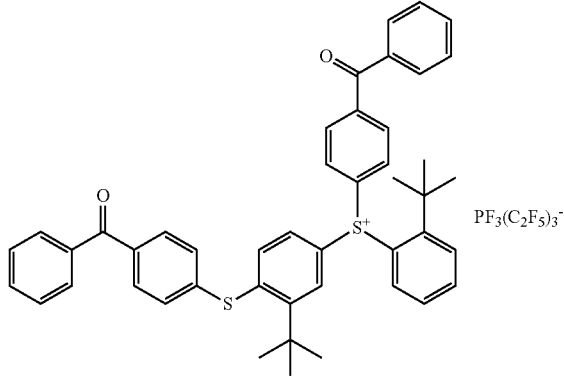

(P2-FP)

Uniformly mixed were 3.0 parts of 4-[(2-tert-butylphenyl)thio]benzophenone produced in Production Example 2, 10 parts of acetonitrile, 0.04 parts of sulfuric acid, and 0.40 parts of aqueous 35% hydrogen peroxide solution, and then allowed to react at 65° C. for 3 hours. The reaction solution was transferred to a rotary evaporator, and the solvent was removed by distillation, so that a mixture of 48% of 4-[(2-tert-butylphenyl)sulfinyl]benzophenone and 52% of 4-[(2-tert-butylphenyl)thio]benzophenone was obtained. The content of the mixture was calculated from the peak area ratio obtained by HPLC analysis. Dissolved was the mixture in 15 parts of dichloromethane, and added dropwise 1.6 parts of trifluoromethanesulfonic anhydride into the solution. The reaction solution was stirred at room temperature for 1 hour, and washed with 15 parts of water. The operation of washing the reaction solution was performed repeatedly until the pH of the water layer became neutral. Then added were 2.0 parts of potassium tris(pentafluoroethyl)trifluorophosphate and 15 parts of water into the reaction solution, and stirred at room temperature for 1 hour. The operation of washing the organic layer with 15 parts of water was performed three times. Then added was 15 parts of hexane into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation, so that compound P2-FP was obtained in a yield of 65%. The product was identified by $^1$H-NMR, $^{19}$F-NMR and LC-MS.

Example 7

Synthesis of Compound P3-FP

[Chemical Formula 14]

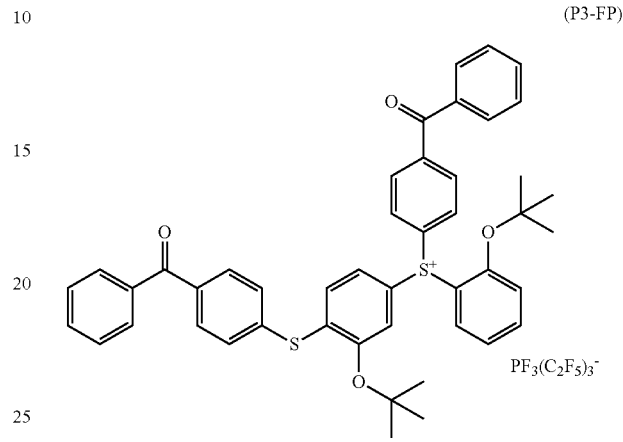

(P3-FP)

Uniformly mixed were 2.9 parts of 4-[(2-tert-butoxyphenyl)thio]benzophenone produced in Production Example 3, 10 parts of acetonitrile, 0.04 parts of sulfuric acid, and 0.39 parts of aqueous 35% hydrogen peroxide solution, and then allowed to react at 65° C. for 3 hours. The reaction solution was transferred to a rotary evaporator, and the solvent was removed by distillation, so that a mixture of 47% of 4-[(2-tert-butoxyphenyl)sulfinyl]benzophenone and 53% of 4-[(2-tert-butoxyphenyl)thio]benzophenone was obtained. The content of the mixture was calculated from the peak area ratio obtained by HPLC analysis. Dissolved was the mixture in 15 parts of dichloromethane, and added dropwise 1.6 parts of trifluoromethanesulfonic anhydride into the solution. The reaction solution was stirred at room temperature for 1 hour, and washed with 15 parts of water. The operation of washing the reaction solution was performed repeatedly until the pH of the water layer became neutral. Then added were 2.0 parts of potassium tris(pentafluoroethyl)trifluorophosphate and 15 parts of water into the reaction solution, and stirred at room temperature for 1 hour. The operation of washing the organic layer with 15 parts of water was performed three times. Then added was 15 parts of hexane into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation. Then the residue was purified by column chromatography (eluent: ethyl acetate/hexane=3/1 in volume ratio), so that compound P3-FP was obtained in a yield of 35%. The product was identified by $^1$H-NMR, $^{19}$F-NMR and LC-MS.

Example 8

Synthesis of Compound P4-FP

[Chemical Formula 15]

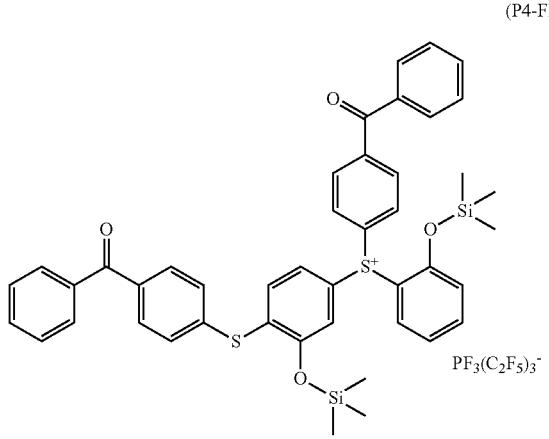

(P4-FP)

Uniformly mixed were 2.9 parts of 4-[(2-trimethylsiloxyphenyl)thio]benzophenone produced in Production Example 4, 10 parts of acetonitrile, 0.04 parts of sulfuric acid, and 0.38 parts of aqueous 35% hydrogen peroxide solution, and then allowed to react at 65° C. for 3 hours. The reaction solution was transferred to a rotary evaporator, and the solvent was removed by distillation, so that a mixture of 47% of 4-[(2-trimethylsiloxyphenyl)sulfinyl]benzophenone and 53% of 4-[(2-trimethylsiloxyphenyl)thio]benzophenone was obtained. The content of the mixture was calculated from the peak area ratio obtained by HPLC analysis. Dissolved was the mixture in 15 parts of dichloromethane, and added dropwise 1.6 parts of trifluoromethanesulfonic anhydride into the solution. The reaction solution was stirred at room temperature for 1 hour, and washed with 15 parts of water. The operation of washing the reaction solution was performed repeatedly until the pH of the water layer became neutral. Then added were 2.0 parts of potassium tris(pentafluoroethyl)trifluorophosphate and 15 parts of water into the reaction solution, and stirred at room temperature for 1 hour. The operation of washing the organic layer with 15 parts of water was performed three times. Then added was 15 parts of hexane into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation. Then the residue was purified by column chromatography (eluent: ethyl acetate/hexane=2.5/1 in volume ratio), so that compound P4-FP was obtained in a yield of 13%. The product was identified by $^1$H-NMR, $^{19}$F-NMR and LC-MS.

Example 9

Synthesis of Compound P5-FP

[Chemical Formula 16]

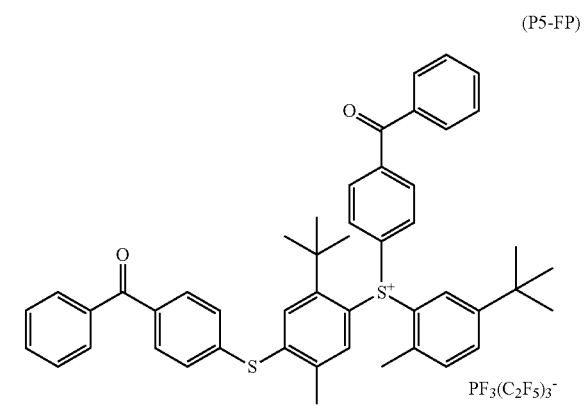

(P5-FP)

Uniformly mixed were 3.0 parts of 4-[(5-tert-butyl-2-methylphenyl)thio]benzophenone produced in Production Example 5, 10 parts of acetonitrile, 0.04 parts of sulfuric acid, and 0.35 parts of aqueous 35% hydrogen peroxide solution, and then allowed to react at 65° C. for 3 hours. The reaction solution was transferred to a rotary evaporator, and the solvent was removed by distillation, so that a mixture of 48% of 4-[(5-tert-butyl-2-methylphenyl)sulfinyl]benzophenone and 52% of 4-[(5-tert-butyl-2-methylphenyl)thio]benzophenone was obtained. The content of the mixture was calculated from the peak area ratio obtained by HPLC analysis. Dissolved was the mixture in 15 parts of dichloromethane, and added dropwise 1.6 parts of trifluoromethanesulfonic anhydride into the solution. The reaction solution was stirred at room temperature for 1 hour, and washed with 15 parts of water. The operation of washing the reaction solution was performed repeatedly until the pH of the water layer became neutral. Then added were 2.0 parts of potassium tris(pentafluoroethyl)trifluorophosphate and 15 parts of water into the reaction solution, and stirred at room temperature for 1 hour. The operation of washing the organic layer with 15 parts of water was performed three times. Then added was 15 parts of hexane into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation, so that compound P5-FP was obtained in a yield of 47%. The product was identified by $^1$H-NMR, $^{19}$F-NMR and LC-MS.

Example 10

Synthesis of Compound P6-FP

[Chemical Formula 17]

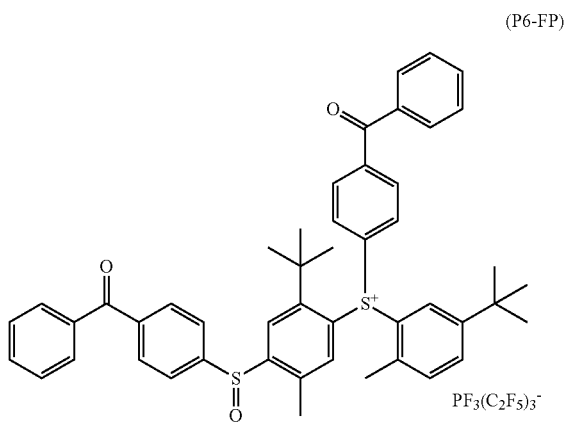

(P6-FP)

Uniformly mixed were 1.0 part of sulfonium salt P5-FP produced in Example 9, 4.2 parts of acetonitrile, 0.01 parts of sulfuric acid, and 0.10 parts of aqueous 35% hydrogen peroxide solution, and then allowed to react at 40° C. for 3 hours. The reaction solution was cooled to room temperature and poured into 10 parts of ion-exchanged water. The mixture was extracted with 5 parts of dichloromethane, and removed the water layer, and again poured into 10 parts of ion-exchanged water, so that the organic layer was washed. Then the operation of washing the organic layer was performed until the pH of the water layer became neutral. The organic layer was transferred to a rotary evaporator, and the solvent was removed by distillation. Then the residue was purified by column chromatography (eluent: ethyl acetate/hexane=3/1 in volume ratio), so that compound P6-FP was obtained in a yield of 80%. The product was identified by $^1$H-NMR, F-NMR and LC-MS.

Example 11

Synthesis of Compound P7-FP

[Chemical Formula 18

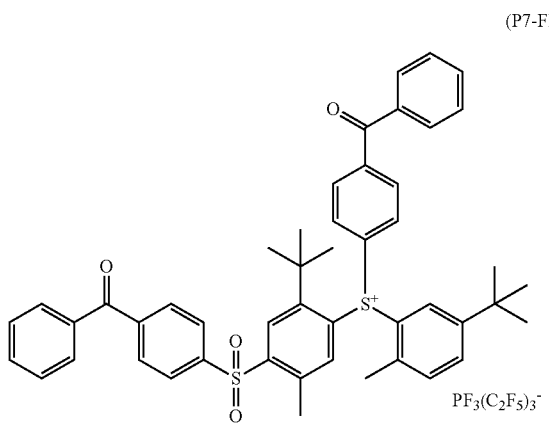

(P7-FP)

Uniformly mixed were 1.0 part of sulfonium salt P5-FP produced in Example 9, 4.2 parts of acetonitrile, 0.01 parts of sulfuric acid, and 0.25 parts of aqueous 35% hydrogen peroxide solution, and then allowed to react at 80° C. for 5 hours. The reaction solution was cooled to room temperature and poured into 10 parts of ion-exchanged water. The mixture was extracted with 5 parts of dichloromethane, and removed the water layer, and again poured into 10 parts of ion-exchanged water, so that the organic layer was washed. Then the operation of washing the organic layer was performed until the pH of the water layer became neutral. The organic layer was transferred to a rotary evaporator, and the solvent was removed by distillation. Then the residue was purified by column chromatography (eluent: ethyl acetate/hexane=2/1 in volume ratio), so that compound P7-FP was obtained in a yield of 37%. The product was identified by $^1$H-NMR, $^{19}$F-NMR and LC-MS.

Example 12

Synthesis of Compound P8-FP

[Chemical Formula 19]

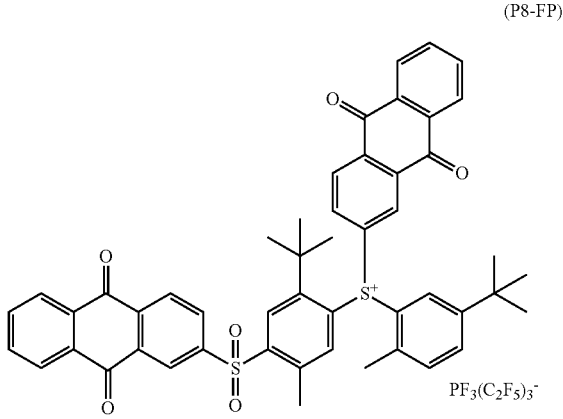

(P8-FP)

Uniformly mixed were 3.0 parts of 2-[(5-tert-butyl-2-methylphenyl)thio]anthraquinone produced in Production Example 6, 20 parts of acetonitrile, 0.04 parts of sulfuric acid, and 0.35 parts of aqueous 35% hydrogen peroxide solution, and then allowed to react at 65° C. for 3 hours. The reaction solution was transferred to a rotary evaporator, and the solvent was removed by distillation, so that a mixture of 47% of 2-[(5-tert-butyl-2-methylphenyl)sulfinyl]anthraquinone and 53% of 2-[(5-tert-butyl-2-methylphenyl)thio]anthraquinone was obtained. The content of the mixture was calculated from the peak area ratio obtained by HPLC analysis. Dissolved was the mixture in 15 parts of dichloromethane, and added dropwise 1.6 parts of trifluoromethanesulfonic anhydride into the solution. The reaction solution was stirred at room temperature for 1 hour, and washed with 15 parts of water. The operation of washing the reaction solution was performed repeatedly until the pH of the water layer became neutral. Then added were 2.0 parts of potassium tris(pentafluoroethyl)trifluorophosphate and 15 parts of water into the reaction solution, and stirred at room temperature for 1 hour. The operation of washing the organic layer with 15 parts of water was performed three times. Then added was 15 parts of toluene into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation, and uniformly mixed were 20 parts of acetonitrile, 0.04 parts of sulfuric acid, and 0.8 parts of aqueous 35% hydrogen peroxide solution, and then allowed to react at 80° C. for 7 hours. The reaction solution was cooled to room temperature and poured into 20 parts of ion-exchanged water. The mixture was extracted with 20 parts of dichloromethane, and removed the water layer, and again poured into 20 parts of ion-exchanged water, so that the organic layer was washed. Then the operation of washing the organic layer was performed until the pH of the water layer became neutral. The organic layer was transferred to a rotary evaporator, and the solvent was removed by distillation. Then the residue was purified by column chromatography (eluent: ethyl acetate/hexane=4/1 in volume ratio), so that compound P8-FP was obtained in a yield of 32%. The product was identified by $^1$H-NMR, $^{19}$F-NMR and LC-MS.

Example 13

Synthesis of Compound P9-FP

[Chemical Formula 20]

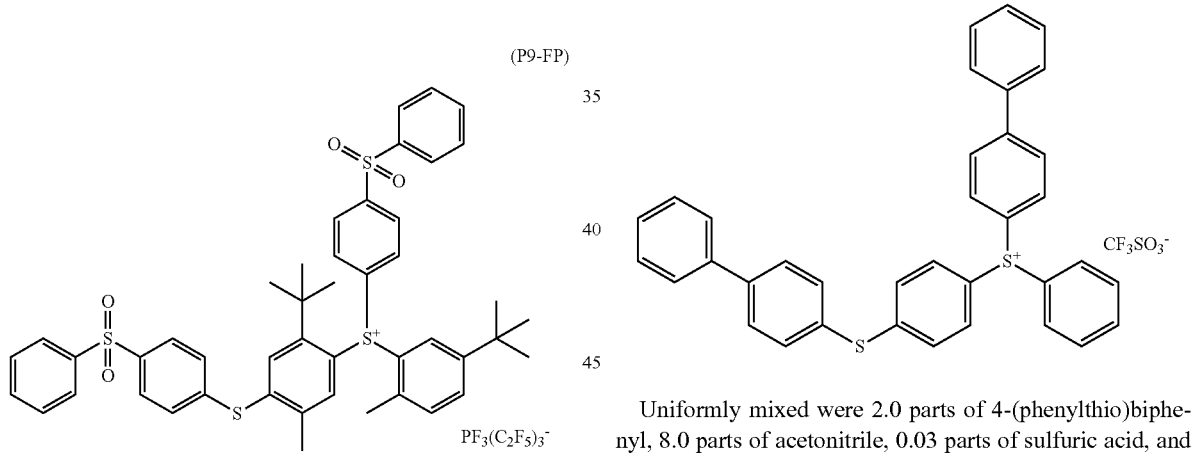

(P9-FP)

Uniformly mixed were 3.0 parts of 4-[(5-tert-butyl-2-methylphenyl)thio]phenylphenylsulfone produced in Production Example 7, 10 parts of acetonitrile, 0.04 parts of sulfuric acid, and 0.35 parts of aqueous 35% hydrogen peroxide solution, and then allowed to react at 65° C. for 7 hours. The reaction solution was transferred to a rotary evaporator, and the solvent was removed by distillation, so that a mixture of 48% of 4-[(5-tert-butyl-2-methylphenyl)sulfinyl]phenylphenylsulfone and 52% of 4-[(5-tert-butyl-2-methylphenyl)thio]phenylphenylsulfone was obtained. The content of the mixture was calculated from the peak area ratio obtained by HPLC analysis. Dissolved was the mixture in 15 parts of dichloromethane, and added dropwise 1.6 parts of trifluoromethanesulfonic anhydride into the solution. The reaction solution was stirred at room temperature for 2 hour, and washed with 15 parts of water. The operation of washing the reaction solution was performed repeatedly until the pH of the water layer became neutral. Then added were 2.0 parts of potassium tris(pentafluoroethyl)trifluorophosphate and 15 parts of water into the reaction solution, and stirred at room temperature for 1 hour. The operation of washing the organic layer with 15 parts of water was performed four times. Then added was 15 parts of toluene into the organic layer, and after stirring, the operation of allowing the solution to stand still for 30 minutes and then removing the upper layer was performed four times, so that the unreacted law material was removed. The lower layer was transferred to a rotary evaporator, and the solvent was removed by distillation, so that compound P9-FP was obtained in a yield of 59%. The product was identified by $^1$H-NMR, $^{19}$F-NMR and LC-MS.

Comparative Example 1

Synthesis of Compound H1-TF

[Chemical Formula 21]

(H1-TF)

Uniformly mixed were 2.0 parts of 4-(phenylthio)biphenyl, 8.0 parts of acetonitrile, 0.03 parts of sulfuric acid, and 0.32 parts of aqueous 35% hydrogen peroxide solution, and then allowed to react at 65° C. for 3 hours. The reaction solution was transferred to a rotary evaporator, and the solvent was removed by distillation, and dissolved was the mixture in 15 parts of dichloromethane, and added dropwise 1.0 part of trifluoromethanesulfonic anhydride into the solution. The reaction solution was stirred at room temperature for 1 hour, and washed with 15 parts of water. The operation of washing the reaction solution was performed repeatedly until the pH of the water layer became neutral. Then added was 15 parts of hexane into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation, so that compound H1-TF was obtained.

Comparative Example 2

Synthesis of Compound H1-FP

[Chemical Formula 22]

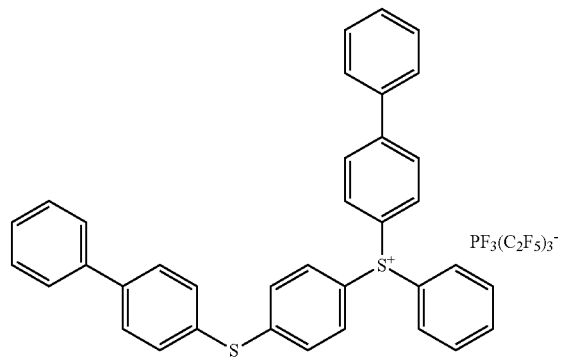

(H1-FP)

Uniformly mixed were 2.0 parts of 4-(phenylthio)biphenyl, 8.0 parts of acetonitrile, 0.03 parts of sulfuric acid, and 0.32 parts of aqueous 35% hydrogen peroxide solution, and then allowed to react at 65° C. for 2 hours. The reaction solution was transferred to a rotary evaporator, and the solvent was removed by distillation. Then uniformly mixed were 6.5 parts of acetonitrile, 1.2 parts of acetic anhydride, 2.0 parts of potassium tris(pentafluoroethyl)trifluorophosphate, and 0.7 parts of sulfuric acid into the residue, and then allowed to react at 60° C. for 2 hours. The reaction solution was cooled to room temperature and poured into 30 parts of water. The mixture was extracted with 15 parts of dichloromethane, and the organic layer was washed with water until the pH of the water layer became neutral. Then added was 15 parts of hexane into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation, so that compound H1-FP was obtained.

Comparative Example 3

Synthesis of Compound H2-FP

[Chemical Formula 23]

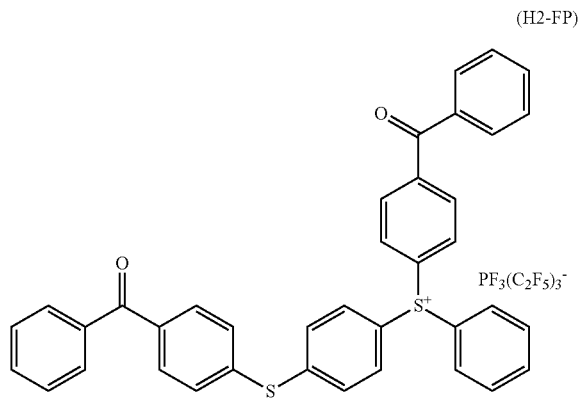

(H2-FP)

Compound H2-FP was obtained as in Comparative Example 2, except that "2.0 parts of 4-(phenylthio)biphenyl" was replaced with "2.0 parts of 4-(phenylthio)benzophenone".

Comparative Example 4

Synthesis of Compound H3-FP

[Chemical Formula 24]

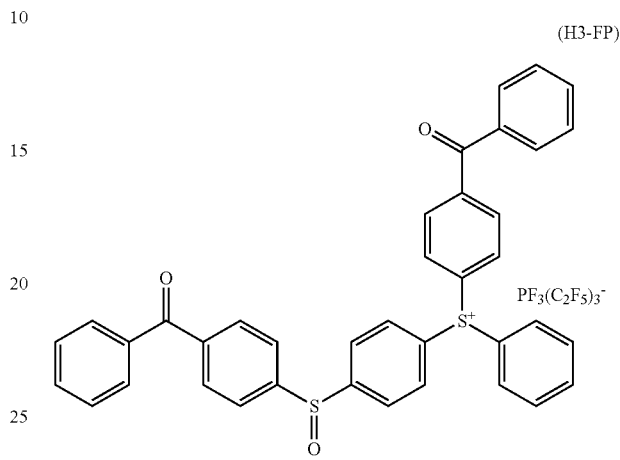

(H3-FP)

Uniformly mixed were 1.0 part of compound H2-FP produced in Comparative Example 3, 4.2 parts of acetonitrile, 0.01 parts of sulfuric acid, and 0.11 parts of aqueous 35% hydrogen peroxide solution, and then allowed to react at 40° C. for 3 hours. The reaction solution was cooled to room temperature and poured into 10 parts of ion-exchanged water. The mixture was extracted with 5 parts of dichloromethane, and removed the water layer, and again poured into 10 parts of ion-exchanged water, so that the organic layer was washed. Then the operation of washing the organic layer was performed until the pH of the water layer became neutral. The organic layer was transferred to a rotary evaporator, and the solvent was removed by distillation. Then the residue was purified by column chromatography (eluent: ethyl acetate/hexane=3/1 in volume ratio), so that compound H3-FP was obtained.

Comparative Example 5

Synthesis of Compound H4-FP

[Chemical Formula 25]

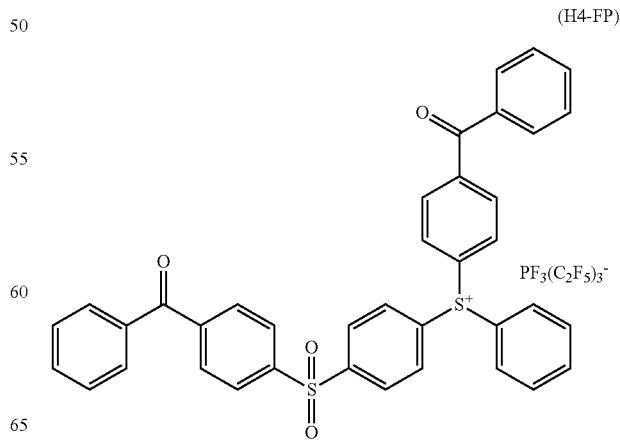

(H4-FP)

Uniformly mixed were 1.0 part of compound H2-FP produced in Comparative Example 3, 4.2 parts of acetonitrile, 0.01 parts of sulfuric acid, and 0.27 parts of aqueous 35% hydrogen peroxide solution, and then allowed to react at 80° C. for 5 hours. The reaction solution was cooled to room temperature and poured into 10 parts of ion-exchanged water. The mixture was extracted with 5 parts of dichloromethane, and removed the water layer, and again poured into 10 parts of ion-exchanged water, so that the organic layer was washed. Then the operation of washing the organic layer was performed until the pH of the water layer became neutral. The organic layer was transferred to a rotary evaporator, and the solvent was removed by distillation. Then the residue was purified by column chromatography (eluent: ethyl acetate/hexane=2/1 in volume ratio), so that compound H4-FP was obtained.

Comparative Example 6

Synthesis of compound H5-FP

[Chemical Formula 26]

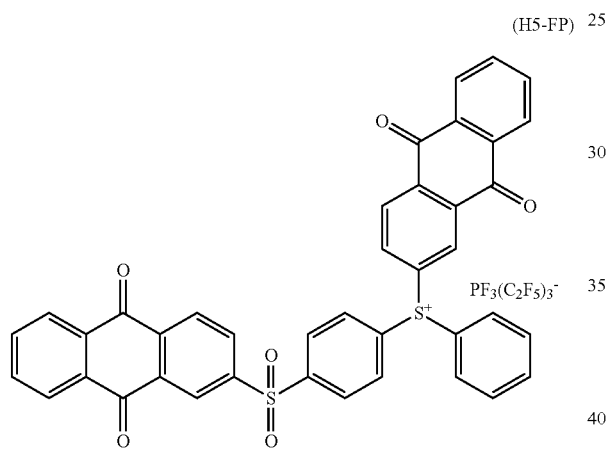

(H5-FP)

Uniformly mixed were 2.9 parts of 2-(phenylthio)anthraquinone, 20 parts of acetonitrile, 0.04 parts of sulfuric acid, and 0.35 parts of aqueous 35% hydrogen peroxide solution, and then allowed to react at 65° C. for 3 hours. The reaction solution was transferred to a rotary evaporator, and the solvent was removed by distillation, so that a mixture of 47% of 2-(phenylsulfinyl)anthraquinone and 53% of 2-(phenylthio)anthraquinone was obtained. The content of the mixture was calculated from the peak area ratio obtained by HPLC analysis. Dissolved was the mixture in 15 parts of dichloromethane, and added dropwise 1.6 parts of trifluoromethanesulfonic anhydride into the solution. The reaction solution was stirred at room temperature for 1 hour, and washed with 15 parts of water. The operation of washing the reaction solution was performed repeatedly until the pH of the water layer became neutral. Then added were 2.0 parts of potassium tris(pentafluoroethyl)trifluorophosphate and 15 parts of water into the reaction solution, and stirred at room temperature for 1 hour. The operation of washing the organic layer with 15 parts of water was performed three times. Then added was 15 parts of toluene into the organic layer, and after stirring, the operation of allowing the solution to stand still for 30 minutes and then removing the upper layer was performed twice, so that the unreacted law material was removed. The lower layer was transferred to a rotary evaporator, and the solvent was removed by distillation, and uniformly mixed were 20 parts of acetonitrile, 0.04 parts of sulfuric acid, and 0.8 parts of aqueous 35% hydrogen peroxide solution, and then allowed to react at 80° C. for 7 hours. The reaction solution was cooled to room temperature and poured into 20 parts of ion-exchanged water. The mixture was extracted with 20 parts of dichloromethane, and removed the water layer, and again poured into 20 parts of ion-exchanged water, so that the organic layer was washed. Then the operation of washing the organic layer was performed until the pH of the water layer became neutral. The organic layer was transferred to a rotary evaporator, and the solvent was removed by distillation, so that compound H5-FP was obtained.

Comparative Example 7

Synthesis of Compound H6-FP

[Chemical Formula 27]

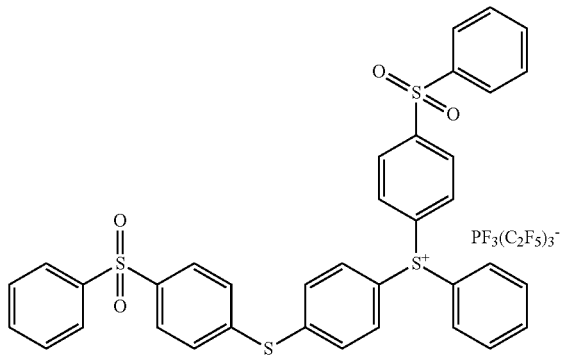

(H6-FP)

Uniformly mixed were 2.0 parts of 4-[(phenylthio)phenyl]phenylsulfone, 8.0 parts of acetonitrile, 0.03 parts of sulfuric acid, and 0.32 parts of aqueous 35% hydrogen peroxide solution, and then allowed to react at 65° C. for 7 hours. The reaction solution was transferred to a rotary evaporator, and the solvent was removed by distillation. Then uniformly mixed were 6.5 parts of acetonitrile, 1.2 parts of acetic anhydride, 2.0 parts of potassium tris(pentafluoroethyl)trifluorophosphate, and 0.7 parts of sulfuric acid into the residue, and then allowed to react at 60° C. for 6 hours. The reaction solution was cooled to room temperature and poured into 30 parts of water. The mixture was extracted with 15 parts of dichloromethane, and the organic layer was washed with water until the pH of the water layer became neutral. Then added was 15 parts of toluene into the organic layer, and after stirring, the operation of allowing the solution to stand still for 30 minutes and then removing the upper layer was performed four times, so that the unreacted law material was removed. The lower layer was transferred to a rotary evaporator, and the solvent was removed by distillation, so that compound H6-FP was obtained.

[Evaluation of Light Absorption Property of Sulfonium Salts]

The photoacid generator (sulfonium salt) of the present invention or the photoacid generator (sulfonium salt) of the comparative example was diluted to 0.25 mmol/L with acetonitrile, so that the solution (each of Examples A1 to A13, Comparative Examples HA1 to HA7) was prepared. Then the absorbance of the solution in a range of 200 nm to 500 nm was measured with a cell having an optical path length (a cell length) of 1 cm by using an ultraviolet-visible spectrophotometer (UV-2550 available from SHIMADZU CORPORATION). The molar extinction coefficient ($\varepsilon_{365}$) of i-line (365 nm) was calculated from the following equation. The results are shown in Table 1. $\varepsilon_{365}$ (L·mol$^{-1}$·cm$^{-1}$)=$A_{365}$/(0.00025 mol/L×1 cm)

[In the equation, A3s represents the absorbance at 365 nm.]

TABLE 1

| | Example of the corresponding photoacid generator | molar extinction coefficient ($\varepsilon_{365}$) (L · mol$^{-1}$ · cm$^{-1}$) |
|---|---|---|
| Example | | |
| A1 | Example 1 | 600 |
| A2 | Example 2 | 600 |
| A3 | Example 3 | 600 |
| A4 | Example 4 | 600 |
| A5 | Example 5 | 600 |
| A6 | Example 6 | 720 |
| A7 | Example 7 | 750 |
| A8 | Example 8 | 750 |
| A9 | Example 9 | 720 |
| A10 | Example 10 | 500 |
| A11 | Example 11 | 500 |
| A12 | Example 12 | 5000 |
| A13 | Example 13 | 800 |
| Comparative Example | | |
| HA1 | C.Example 1 | 590 |
| HA2 | C.Example 2 | 590 |
| HA3 | C.Example 3 | 720 |
| HA4 | C.Example 4 | 500 |
| HA5 | C.Example 5 | 500 |
| HA6 | C.Example 6 | 5100 |
| HA7 | C.Example 7 | 800 |

(Preparation and Evaluation of Energy Ray-Curable Compositions)

<Preparation of Curable Compositions>

The photoacid generator (sulfonium salt) of the present invention or the photoacid generator (sulfonium salt) of the comparative example was dissolved in an amount to be formulated shown in Table 2 in solvent-1 (propylene carbonate). Subsequently, the solution was uniformly mixed with an epoxide (shown below) as a cationically polymerizable compound, in an amount to be formulated shown in Table 2 (parts by weight), so that an energy ray-curable composition (each of Examples C1 to C15, Comparative Examples HC1 to HC9) was prepared.

<Epoxy Resins>
EP-1: 3,4-epoxycyclohexylmethyl-3,4-epoxycyclohexanecarboxylate
EP-2: 2,2-bis(4-glycidyloxyphenyl)propane
EP-3: 3-ethyl-3-{[(3-ethyloxetane-3-yl)methoxy]methyl}oxetane

TABLE 2

| | Example of the corresponding photoacid generator | Amount of photoacid generator formulated | Solvent-1 | Epoxide | | |
|---|---|---|---|---|---|---|
| | | | | EP-1 | EP-2 | EP-1/EP-3 |
| Example | | | | | | |
| C1 | Example 1 | 3.00 | 3.00 | 100 | — | — |
| C2 | Example 2 | 0.60 | 0.60 | 100 | — | — |
| C3 | Example 3 | 0.60 | 0.60 | 100 | — | — |
| C4 | Example 4 | 0.60 | 0.60 | 100 | — | — |
| C5 | Example 5 | 0.60 | 0.60 | 100 | — | — |
| C6 | Example 6 | 0.60 | 0.60 | 100 | — | — |
| C7 | Example 7 | 0.60 | 0.60 | 100 | — | — |
| C8 | Example 8 | 0.60 | 0.60 | 100 | — | — |
| C9 | Example 9 | 0.60 | 0.60 | 100 | — | — |
| C10 | Example 9 | 0.60 | 0.60 | — | 100 | — |
| C11 | Example 9 | 0.60 | 0.60 | — | — | 50/50 |
| C12 | Example 10 | 0.60 | 0.60 | 100 | — | — |
| C13 | Example 11 | 0.60 | 0.60 | 100 | — | — |
| C14 | Example 12 | 0.30 | 0.30 | 100 | — | — |
| C15 | Example 13 | 0.60 | 0.60 | 100 | — | — |
| Comparative Example | | | | | | |
| HC1 | C.Example 1 | 3.00 | 3.00 | 100 | — | — |
| HC2 | C.Example 2 | 0.60 | 0.60 | 100 | — | — |
| HC3 | C.Example 3 | 0.60 | 0.60 | 100 | — | — |
| HC4 | C.Example 3 | 0.60 | 0.60 | — | 100 | — |
| HC5 | C.Example 3 | 0.60 | 0.60 | — | — | 50/50 |
| HC6 | C.Example 4 | 0.60 | 0.60 | 100 | — | — |
| HC7 | C.Example 5 | 0.60 | 0.60 | 100 | — | — |
| HC8 | C.Example 6 | 0.30 | 0.30 | 100 | — | — |
| HC9 | C.Example 7 | 0.60 | 0.60 | 100 | — | — |

The sulfonium salt obtained in Example 1, or Comparative Example 1 was formulated in a relatively large amount in order to evaluate on the same condition, because it was a trifluoromethanesulfonate and therefore the acid generated therefrom had a weak strength as compared with that generated from hexafluoroantimonate, tris(pentafluoroethyl) trifluorophosphate, tetrakis(pentafluorophenyl)borate, or tetrakis(pentafluorophenyl) gallate obtained in one of Examples 2 to 13 or Comparative Examples 2 to 7, and had low activity for cationic polymerization. According to this, the solvent-1 was also formulated in a relatively large amount. Also, the sulfonium salt obtained in Example 12, or Comparative Example 6 was formulated in a relatively small amount in order to evaluate on the same condition, because the molar extinction coefficient is large shown from a result of Table 1. According to this, the solvent-1 was also formulated in a relatively small amount.

<Evaluation of Photosensitivity (Photo-Curability)>

The energy ray-curable composition obtained above was applied to a polyethylene terephthalate (PET) film using an applicator (40 μm). Using an ultraviolet irradiator, the PET film was irradiated with ultraviolet light whose wavelength was restricted with filters. The filter used was L-34 (manufactured by Kenko Kougaku Corporation, a filter for cutting off light with wavelengths of less than 340 nm). Forty minutes after the irradiation, the pencil hardness (JIS K 5600-5-4: 1999) of the coating film hardness was measured and evaluated according to the criteria below (the coating film had a thickness of about 40 μm after the curing). The results were shown in Table 3. The higher pencil hardness indicates that the photo-curability of the energy ray-curable composition is better, namely, the ability of the sulfonium salt to initiate polymerization of the cationically polymerizable compound (the photosensitivity of the sulfonium salt) is excellent.

(Evaluation Criteria)
⊚: The pencil hardness is H or higher.
○: The pencil hardness is from HB to B.
Δ: The pencil hardness is from 2 B to 4 B.
x: Due to liquidness or tackiness, it is not possible to measure the pencil hardness.

(Ultraviolet Light Irradiation Conditions)
Ultraviolet ray irradiator: belt conveyor-type UV irradiator (manufactured by EYE GRAPHICS Co., Ltd.)
Lamp: 1.5 kW high-pressure mercury lamp
Filter: L-34 (manufactured by Kenko Kougaku Corporation)
Irradiance (measured with a 365 nm head photometer): 100 mW/cm$^2$
Integral light dose (measured with a 365 nm head photometer):
condition-1, 100 mJ/cm$^2$
condition-2, 200 mJ/cm$^2$
condition-3, 300 mJ/cm$^2$

TABLE 3

| Example | Photo-Curability | | |
|---|---|---|---|
| | condition-1 | condition-2 | condition-3 |
| C1 | ○ | ○ | ○ |
| C2 | ○ | ○ | ◎ |
| C3 | ○ | ○ | ◎ |
| C4 | ○ | ○ | ◎ |
| C5 | ○ | ○ | ◎ |
| C6 | ○ | ◎ | ◎ |
| C7 | ○ | ◎ | ◎ |
| C8 | ○ | ◎ | ◎ |
| C9 | ○ | ◎ | ◎ |
| C10 | ○ | ◎ | ◎ |
| C11 | ○ | ◎ | ◎ |
| C12 | ○ | ◎ | ◎ |
| C13 | ○ | ◎ | ◎ |
| C14 | ○ | ◎ | ◎ |
| C15 | ○ | ◎ | ◎ |
| Comparative Example | | | |
| HC1 | X | Δ | Δ |
| HC2 | X | Δ | ○ |
| HC3 | Δ | ○ | ○ |
| HC4 | Δ | ○ | ○ |
| HC5 | Δ | ○ | ○ |
| HC6 | Δ | ○ | ○ |
| HC7 | Δ | ○ | ○ |
| HC8 | Δ | ○ | ○ |
| HC9 | Δ | ○ | ○ |

In the results of Table 1 and Table 3, it is found that the photoacid generators of the present invention have an excellent ability to cure a cationically polymerizable compound (photosensitivity), because of having a substituent A1 or A2 in general formula (1), though light absorption is not big, compared with the photoacid generators of Comparative Examples; as is seen from the comparison of the photoacid generator (sulfonium salt), for example, Examples C1 to C5 with Comparative Examples HC1 to HC2, Examples C6 to C11 with Comparative Examples HC3 to HC5, Example C12 with Comparative Example HC6, Example $C_{13}$ with Comparative Example HC7, Example C14 with Comparative Example HC8, and Example $C_{15}$ with Comparative Example HC9.

[Evaluation of Chemically Amplified Positive Photoresist Compositions]

<Preparation of Samples for Evaluation>

As shown in Table 4, 1 part by weight of the ingredient (A)(photoacid generator), 40 parts by weight of the resin ingredient (B) (the resin represented by chemical formula (Resin-1) described below), and 60 parts by weight of the resin ingredient (C) (a novolac resin obtained by addition-condensation of m-cresol and p-cresol in the presence of formaldehyde and an acid catalyst) were uniformly dissolved in solvent-2 (propylene glycol monomethyl ether acetate). The solution was filtered through a membrane filter with a pore size of 1 μm, so that a positive photoresist composition with solids content of 40% by weight (each of Examples P1 to P13) was prepared.

A comparative chemically amplified positive photoresist composition (each of Comparative Examples HP1 to HP7) was also prepared in the same manner using the amounts formulated shown in Table 4.

TABLE 4

| Example | Example of the corresponding photoacid generator (A) | Amount of photoacid generator (A) formulated | Resin ingredient (B) | Resin ingredient (C) | Solvent-2 |
|---|---|---|---|---|---|
| P1 | Example 1 | 1 | 40 | 60 | 151.5 |
| P2 | Example 2 | 1 | 40 | 60 | 151.5 |
| P3 | Example 3 | 1 | 40 | 60 | 151.5 |
| P4 | Example 4 | 1 | 40 | 60 | 151.5 |
| P5 | Example 5 | 1 | 40 | 60 | 151.5 |
| P6 | Example 6 | 1 | 40 | 60 | 151.5 |
| P7 | Example 7 | 1 | 40 | 60 | 151.5 |
| P8 | Example 8 | 1 | 40 | 60 | 151.5 |
| P9 | Example 9 | 1 | 40 | 60 | 151.5 |
| P10 | Example 10 | 1 | 40 | 60 | 151.5 |
| P11 | Example 11 | 1 | 40 | 60 | 151.5 |
| P12 | Example 12 | 1 | 40 | 60 | 151.5 |
| P13 | Example 13 | 1 | 40 | 60 | 151.5 |
| Comparative Example | | | | | |
| HP1 | C.Example 1 | 1 | 40 | 60 | 151.5 |
| HP2 | C.Example 2 | 1 | 40 | 60 | 151.5 |
| HP3 | C.Example 3 | 1 | 40 | 60 | 151.5 |
| HP4 | C.Example 4 | 1 | 40 | 60 | 151.5 |
| HP5 | C.Example 5 | 1 | 40 | 60 | 151.5 |
| HP6 | C.Example 6 | 1 | 40 | 60 | 151.5 |
| HP7 | C.Example 7 | 1 | 40 | 60 | 151.5 |

[Chemical Formula 28]

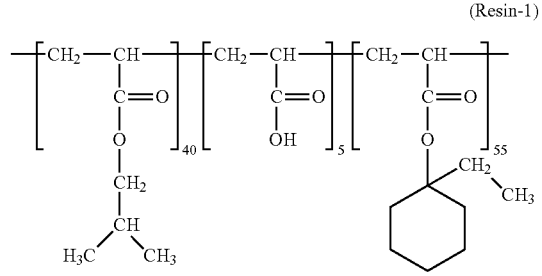

(Resin-1)

<Sensitivity Evaluation>

The positive resist composition prepared in each of Examples P1 to P28 and Comparative Examples HP1 to HP7 described above was applied to a silicon wafer substrate by spin coating and then dried so that a photoresist layer with a thickness of about 20 μm was obtained. The resist layer was prebaked on a hot plate at 130° C. for 6 minutes. After the prebaking, pattern exposure (i-line) was performed using TME-150RSC (manufactured by TOPCON CORPORATION), and post-exposure baking (PEB) was performed with a hot plate at 75° C. for 5 minutes. Subsequently, a developing treatment was performed for 5 minutes by an immersion method using an aqueous solution of 2.38% by weight tetramethylammonium hydroxide. The layer was washed with flowing water, and nitrogen was blown, so that a 10 μm line and space (L&S) pattern was obtained. In addition, measurement was performed to determine the minimum exposure dose below which no residual pattern was observed, namely, the minimum essential exposure dose (corresponding to the sensitivity) necessary for the formation of the resist pattern. As the essential exposure dose was little, the photo-reactivity of the positive resist composition was excellent, that is the photosensitivity of the sulfonium salt was excellent.

<Evaluation of Storage Stability>

Using the chemically amplified positive photoresist composition prepared as described above, the photosensitivity (sensitivity) immediately after the preparation and after one-month storage at 40° C. was evaluated as described above, and the storage stability was evaluated according to the following criteria.
- ○: After one-month storage at 40° C., the sensitivity is changed by less than 5% from that immediately after the preparation.
- x: After one-month storage at 40° C., the sensitivity is changed by 5% or more from that immediately after the preparation.

<Evaluation of Pattern Shape>

The cross-sectional shape of the 10 μm L&S pattern formed on the silicon wafer substrate by the above process was measured for the lower side size La and the upper side size Lb using a scanning electron microscope, and the pattern shape was evaluated according to the criteria below. The results are shown in Table 4.
- ◎: 0.90≤Lb/La≤1
- ○: 0.85≤Lb/La<0.90
- x: Lb/La<0.85

TABLE 5

| Example | Example of the corresponding photoacid generator (A) | Minimum essential exposure dose (mJ/cm²) | Storage stability | Pattern shape |
|---|---|---|---|---|
| P1 | Example 1 | 270 | ○ | ○ |
| P2 | Example 2 | 240 | ○ | ○ |
| P3 | Example 3 | 240 | ○ | ○ |
| P4 | Example 4 | 240 | ○ | ○ |
| P5 | Example 5 | 240 | ○ | ○ |
| P6 | Example 6 | 200 | ○ | ○ |
| P7 | Example 7 | 220 | ○ | ○ |
| P8 | Example 8 | 220 | ○ | ○ |
| P9 | Example 9 | 200 | ○ | ○ |
| P10 | Example 10 | 190 | ○ | ○ |
| P11 | Example 11 | 190 | ○ | ○ |
| P12 | Example 12 | 150 | ○ | ○ |
| P13 | Example 13 | 180 | ○ | ○ |

TABLE 5-continued

| Example | Example of the corresponding photoacid generator (A) | Minimum essential exposure dose (mJ/cm²) | Storage stability | Pattern shape |
|---|---|---|---|---|
| Comparative Example | | | | |
| HP1 | C.Example 1 | 300 | ○ | ○ |
| HP2 | C.Example 2 | 310 | ○ | ○ |
| HP3 | C.Example 3 | 290 | ○ | ○ |
| HP4 | C.Example 4 | 270 | ○ | ○ |
| HP5 | C.Example 5 | 260 | ○ | ○ |
| HP6 | C.Example 6 | 200 | ○ | ○ |
| HP7 | C.Example 7 | 260 | ○ | ○ |

In the results of Table 1 and Table 5, it is found that the photoacid generators of the present invention have an excellent photosensitivity as the chemically amplified positive photoresist, because of having a substituent A1 or A2 in general formula (1), though light absorption is not big, compared with the photoacid generators of Comparative Examples; as is seen from the comparison of the photoacid generator (sulfonium salt), for example, Examples P1 to P5 with Comparative Examples HP1 to HP2, Examples P6 to P9 with Comparative Example HP3, Example P10 with Comparative Example HP4, Example P11 with Comparative Example HP5, Example P12 with Comparative Example HP6, and Example P13 with Comparative Example HP7.

[Evaluation of Chemically Amplified Negative Photoresist Compositions]

<Preparation of Samples for Evaluation>

As shown in Table 6, 1 part by weight of the ingredient (E)(photoacid generator), 100 parts by weight of the phenolic resin ingredient (F) (a copolymer (Mw=10,000) of p-hydroxystyrene/styrene=80/20 (in molar ratio)), 20 parts by weight of the crosslinking agent ingredient (G)(hexamethoxymethylmelamine (trade name: "NIKALAC MW-390", manufactured by Sanwa Chemical Co., Ltd.), 10 parts by weight of the crosslinked fine particles ingredient (H) (a copolymer comprising butadiene/acrylonitrile/hydroxybutylmethacrylate/methacrylicacid/divinylbenzene=64/20/8/6/2 (% by weight) (average particle size=65 nm, Tg=−38° C.)), and 5 parts by weight of the adhesion auxiliary agent ingredient (I) (γ-glycidoxypropyltrimethoxysilane (trade name: "S510", manufactured by CHISSO CORPORATION)) were uniformly dissolved in 145 parts by weight of solvent-3 (ethyl lactate), so that the chemically amplified negative photoresist composition of the invention (each of Examples N1 to N13) was prepared.

A comparative chemically amplified negative photoresist composition (each of Comparative Examples HN1 to HN7) was also prepared in the same manner using the amounts formulated shown in Table 6.

TABLE 6

| Example | Examples of the corresponding photoacid generator (E) | Amount of photoacid generator (E) formulated | Resin ingredient (F) | Resin ingredient (G) | Crosslinked fine particles ingredient (H) | Adhesion auxiliary agent (I) | Solvent-3 |
|---|---|---|---|---|---|---|---|
| N1 | Example 1 | 1 | 100 | 20 | 10 | 5 | 145 |
| N2 | Example 2 | 1 | 100 | 20 | 10 | 5 | 145 |
| N3 | Example 3 | 1 | 100 | 20 | 10 | 5 | 145 |
| N4 | Example 4 | 1 | 100 | 20 | 10 | 5 | 145 |
| N5 | Example 5 | 1 | 100 | 20 | 10 | 5 | 145 |
| N6 | Example 6 | 1 | 100 | 20 | 10 | 5 | 145 |
| N7 | Example 7 | 1 | 100 | 20 | 10 | 5 | 145 |
| N8 | Example 8 | 1 | 100 | 20 | 10 | 5 | 145 |
| N9 | Example 9 | 1 | 100 | 20 | 10 | 5 | 145 |
| N10 | Example 10 | 1 | 100 | 20 | 10 | 5 | 145 |
| N11 | Example 11 | 1 | 100 | 20 | 10 | 5 | 145 |

TABLE 6-continued

| Example | Examples of the corresponding photoacid generator (E) | Amount of photoacid generator (E) formulated | Resin ingredient (F) | Resin ingredient (G) | Crosslinked fine particles ingredient (H) | Adhesion auxiliary agent (I) | Solvent-3 |
|---|---|---|---|---|---|---|---|
| N12 | Example 12 | 1 | 100 | 20 | 10 | 5 | 145 |
| N13 | Example 13 | 1 | 100 | 20 | 10 | 5 | 145 |
| C.Example | | | | | | | |
| HN1 | C.Example 1 | 1 | 100 | 20 | 10 | 5 | 145 |
| HN2 | C.Example 2 | 1 | 100 | 20 | 10 | 5 | 145 |
| HN3 | C.Example 3 | 1 | 100 | 20 | 10 | 5 | 145 |
| HN4 | C.Example 4 | 1 | 100 | 20 | 10 | 5 | 145 |
| HN5 | C.Example 5 | 1 | 100 | 20 | 10 | 5 | 145 |
| HN6 | C.Example 6 | 1 | 100 | 20 | 10 | 5 | 145 |
| HN7 | C.Example 7 | 1 | 100 | 20 | 10 | 5 | 145 |

<Sensitivity Evaluation>

Each composition was applied to a silicon wafer substrate by spin coating and then dried by heating with a hot plate at 110° C. for 3 minutes, so that a resin coating film with a thickness of about 20 μm was obtained. Subsequently, pattern exposure (i-line) was performed using TME-150RSC (manufactured by TOPCON CORPORATION), and post-exposure baking (PEB) was performed with a hot plate at 110° C. for 3 minutes. Subsequently, a developing treatment was performed for 2 minutes by an immersion method using an aqueous solution of 2.38% by weight tetramethylammonium hydroxide. The layer was washed with flowing water, and nitrogen was blown, so that a 10 μm line and space pattern was obtained. In addition, measurement was performed to determine the minimum essential exposure dose (corresponding to the sensitivity) necessary for the formation of a pattern with a remaining thickness ratio of 95% or more (which indicates the ratio of the remaining film after the development to that before the development). As the essential exposure dose was little, the photo-reactivity of the negative resist composition was excellent, that is the photosensitivity of the sulfonium salt was excellent.

<Evaluation of Storage Stability>

Using the chemically amplified negative photoresist composition prepared as described above, the photosensitivity (sensitivity) immediately after the preparation and after one-month storage at 40° C. was evaluated as described above, and the storage stability was evaluated according to the following criteria.
- ○: After one-month storage at 40° C., the sensitivity is changed by less than 5% from that immediately after the preparation.
- ×: After one-month storage at 40° C., the sensitivity is changed by 5% or more from that immediately after the preparation.

<Evaluation of Pattern Shape>

The cross-sectional shape of the 20 μm L&S pattern formed on the silicon wafer substrate by the above process was measured for the lower side size La and the upper side size Lb using a scanning electron microscope, and the pattern shape was evaluated according to the criteria below. The results are shown in Table 7.
- ⊚: 0.90≤La/Lb≤1
- ○: 0.85≤La/Lb<0.90
- ×: La/Lb<0.85

TABLE 7

| Example | Example of the corresponding photoacid generator (E) | Minimum essential exposure dose (mJ/cm$^2$) | Storage stability | Pattern shape |
|---|---|---|---|---|
| N1 | Example 1 | 200 | ○ | ○ |
| N2 | Example 2 | 170 | ○ | ○ |
| N3 | Example 3 | 170 | ○ | ○ |
| N4 | Example 4 | 170 | ○ | ○ |
| N5 | Example 5 | 170 | ○ | ○ |
| N6 | Example 6 | 130 | ○ | ○ |
| N7 | Example 7 | 150 | ○ | ○ |
| N8 | Example 8 | 150 | ○ | ○ |
| N9 | Example 9 | 130 | ○ | ○ |
| N10 | Example 10 | 140 | ○ | ○ |
| N11 | Example 11 | 130 | ○ | ○ |
| N12 | Example 12 | 110 | ○ | ○ |
| N13 | Example 13 | 130 | ○ | ○ |
| Comparative Example | | | | |
| HN1 | C.Example 1 | 290 | ○ | ○ |
| HN2 | C.Example 2 | 250 | ○ | ○ |
| HN3 | C.Example 3 | 230 | ○ | ○ |
| HN4 | C.Example 4 | 200 | ○ | ○ |
| HN5 | C.Example 5 | 200 | ○ | ○ |
| HN6 | C.Example 6 | 150 | ○ | ○ |
| HN7 | C.Example 7 | 210 | ○ | ○ |

In the results of Table 1 and Table 7, it is found that the photoacid generators of the present invention have an excellent photosensitivity as the chemically amplified negative photoresist, because of having a substituent A1 or A2 in general formula (1), though light absorption is not big, compared with the photoacid generators of Comparative Examples; as is seen from the comparison of the photoacid generator (sulfonium salt), for example, Examples N1 to N5 with Comparative Examples HN1 to HN2, Examples N6 to N9 with Comparative Example HN3, Example N10 with Comparative Example HN4, Example N11 with Comparative Example HN5, Example N12 with Comparative Example HN6, and Example N13 with Comparative Example HN7.

INDUSTRIAL APPLICABILITY

The sulfonium salt of the present invention is suitably used for paints, coating agents, various coating materials (hard coats, anti-fouling coating materials, anti-fogging coating materials, anti-corrosion coating materials, optical fibers and the like), back surface treatment agents for pressure sensitive adhesive tapes, release coating materials of release sheets for pressure sensitive adhesive labels (release papers, release plastic films, release metal foils and the like), printing plates, dental materials (dental formulations and dental composites), ink compositions, inkjet ink compositions, positive resists (for formation of connection terminals and wiring patterns in production of electronic components such as circuit boards, CSP and MEMS elements), resist films, liquid resists and negative resists (permanent film materials of surface protecting films, interlayer dielectric films, planarizing films for semiconductor elements, etc.), resists for MEMS, positive photosensitive materials, negative photosensitive materials, various adhesives (various temporary fixing agents for electronic components, adhesives for HDD, adhesives for pick-up lenses, functional films for FPD (polarizing plates, antireflection films and the like), etc.), holographic resins, FPD materials (color filters, black matrices, partition wall materials, photospacers, ribs, orientation films for liquid crystals, scaling agents for FPD and the like), optical members, molding materials (for building materials, optical components and lenses), casting materials, putty materials, glass fiber impregnating agents, fillers, sealing materials, sealants, photosemiconductor (LED) sealing materials, optical waveguide materials, nano-imprint materials, stereolithography materials, and micro-stereolithography materials.

The invention claimed is:

1. A sulfonium salt represented by general formula (1) described below,

[Chemical Formula 1]

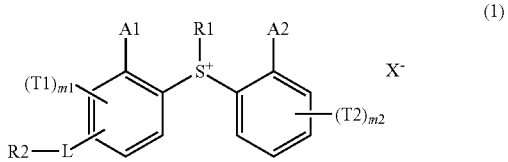

(1)

[in formula (1), R1 and R2 each independently represent an aryl group having 6 to 14 carbon atoms, and some of hydrogen atoms in the aryl group may be substituted with a substituent (t); the substituent (t) represents an alkyl group having 1 to 8 carbon atoms or an aryl group having 6 to 10 carbon atoms, the substituent (t) may be bonded together directly via a single bond, or through a group represented by —SO—, —SO$_2$—, or —CO, with R1 and R2; A1 and A2 each independently represent a hydrogen atom, a branched alkyl group having 3 to 7 carbon atoms, a branched alkoxy group having 3 to 7 carbon atoms, a tertiary silyl group having 3 to 9 carbon atoms, or a tertiary siloxy group having 3 to 9 carbon atoms, provided that both of A1 and A2 do not represent a hydrogen atom; T1 and T2 each independently represent an alkyl group having 1 to 7 carbon atoms, an alkoxy group having 1 to 7 carbon atoms, a silyl group having 3 to 9 carbon atoms, or a siloxy group having 3 to 9 carbon atoms; m1 and m2 each represent the number of occurrences of each of T1 and T2, m1 represents an integer of 0 to 3, m2 represents an integer of 0 to 4; L represents —O—, —S—, —SO—, —SO$_2$—, or —CO; S represents sulfur atom, O represents oxygen atom, C represents carbon atom; and X$^-$ represents a monovalent polyatomic anion].

2. The sulfonium salt according to claim 1, wherein A1 and A2 each a group selected from a tertiary butyl group, a tertiary butoxy group and a trimethylsiloxy group.

3. The sulfonium salt according to claim 1, wherein L is a group represented by —S—, —SO—, or —SO$_2$—, and R1 and R2 are the same group.

4. The sulfonium salt according to claim 1, wherein X$^-$ is an anion represented by MY$_a^-$, (Rf)$_b$PF$_{6-b}$—, R$^3_c$BY$_{4-c}$—, R$^3_c$GaY$_{4-c}$, R$^4$SO$_3$—, (R$^4$SO$_2$)$_{3-c}$—, or (R$^4$SO$_2$)$_2$N— {wherein M represents a phosphorus atom, a boron atom, an arsenic atom, or an antimony atom; Y represents a halogen atom; Rf represents an alkyl group, 80% by mole or more of whose hydrogen atoms are substituted with fluorine atoms; P represents a phosphorus atom; F represents a fluorine atom; R$^3$ represents a phenyl group, at least one of whose hydrogen atoms is substituted with a halogen atom, a trifluoromethyl group, a nitro group, or a cyano group; B represents a boron atom; Ga represents a gallium atom; R$^4$ represents an alkyl group having 1 to 20 carbon atoms, a perfluoroalkyl group having 1 to 20 carbon atoms, or an aryl group having 6 to 20 carbon atoms; S represents sulfur atom, O represents oxygen atom, C represents carbon atom, N represents nitrogen atom; a represents an integer of 4 to 6, b represents an integer of 1 to 5, and c represents an integer of 1 to 4}.

5. The sulfonium salt according to claim 1, wherein X$^-$ is an anion represented by SbF$_6$—, PF$_6$—, BF$_4$—, (CF$_3$CF$_2$)$_3$PF$_3$—, (CF$_3$CF$_2$CF$_2$CF$_2$)$_3$PF$_3$—(C$_6$F$_5$)$_4$B—, (C$_6$H$_5$)(C$_6$F$_5$)$_3$B—, ((CF$_3$)$_2$C$_6$H$_3$)$_4$B—, (C$_6$F$_5$)$_4$Ga—, ((CF$_3$)$_2$CH)$_4$Ga—, trifluoromethanesulfonate anion, nonafluorobutanesulfonate anion, methanesulfonate anion, camphorsulfonate anion, benzenesulfonate anion, or p-toluenesulfonate anion.

6. A photoacid generator, comprising the sulfonium salt according to claim 1.

7. An energy ray-curable composition, comprising the photoacid generator according to claim 6 and a cationically polymerizable compound.

8. A cured product obtained by curing the energy ray-curable composition according to claim 7.

9. A chemically amplified positive photoresist composition, comprising: an ingredient (A) comprising the photoacid generator according to claim 6; and a resin ingredient (B) increasing its solubility in an alkali under the action of an acid.

10. The chemically amplified positive photoresist composition according to claim 9, wherein the resin ingredient (B) comprises at least one resin selected from the group consisting of a novolac resin (B1), a polyhydroxystyrene resin (B2), and an acrylic resin (B3).

11. The chemically amplified positive photoresist composition according to claim 9, further comprising an alkali-soluble resin (C) and an acid diffusion controlling agent (D).

12. A method for forming a resist pattern, comprising: a lamination step of laminating, on a support, a photoresist layer with a thickness of 10 to 150 μm comprising the chemically amplified positive photoresist composition according to claim 9 to obtain a photoresist laminate; an exposure step of site-selectively irradiating the photoresist laminate with light or a radiation; and a development step of developing the photoresist laminate after the exposure step to obtain a resist pattern.

13. A chemically amplified negative photoresist composition, comprising: an ingredient (E) comprising the photoacid generator according to claim 6; an ingredient (F) that is an alkali-soluble resin having a phenolic hydroxyl group; and a crosslinking agent ingredient (G).

14. The chemically amplified negative photoresist composition according to claim 13, further comprising a crosslinked fine particles ingredient (H).

15. A cured product obtained by curing the chemically amplified negative photoresist composition according to claim 13.

* * * * *